US012757757B2

(12) United States Patent
Nuotio et al.

(10) Patent No.: US 12,757,757 B2
(45) Date of Patent: Oct. 6, 2026

(54) POWER SEMICONDUCTOR PACKAGE

(71) Applicant: PIERBURG GMBH, Neuss (DE)

(72) Inventors: Mika Nuotio, San Jose, CA (US); Dieter Jelinek, Kaarst (DE); Oguz Demir, Heilbronn (DE); Patrick Bauer, Hassmersheim (DE)

(73) Assignee: PIERBURG GMBH, Neuss (DE)

( * ) Notice: Subject to any disclaimer, the term of this patent is extended or adjusted under 35 U.S.C. 154(b) by 466 days.

(21) Appl. No.: 18/553,211

(22) PCT Filed: Feb. 25, 2022

(86) PCT No.: PCT/EP2022/054763

§ 371 (c)(1),
(2) Date: Sep. 29, 2023

(87) PCT Pub. No.: WO2022/207203

PCT Pub. Date: Oct. 6, 2022

(65) Prior Publication Data

US 2024/0355753 A1 Oct. 24, 2024

Related U.S. Application Data

(63) Continuation of application No. PCT/EP2021/058654, filed on Apr. 1, 2021.

(51) Int. Cl.
*H01L 23/538* (2006.01)
*H10W 70/40* (2026.01)
(Continued)

(52) U.S. Cl.
CPC ....... *H10W 70/481* (2026.01); *H10W 70/457* (2026.01); *H10W 70/611* (2026.01);
(Continued)

(58) Field of Classification Search
CPC ............. H10W 70/481; H10W 70/457; H10W 70/611; H10W 70/65; H10W 90/00;
(Continued)

(56) References Cited

U.S. PATENT DOCUMENTS 5,933,341 A * 8/1999 Kuriyama ......... H02M 7/53803 361/18
6,021,060 A * 2/2000 Tanaka .................. H02M 7/003 363/132
(Continued)

FOREIGN PATENT DOCUMENTS

CN 110491868 A * 11/2019 ............ H02M 7/003
EP 3203625 A1 * 8/2017 .......... H10W 44/501
(Continued)

*Primary Examiner* — Jarrett J Stark
(74) *Attorney, Agent, or Firm* — Norman B. Thot

(57) ABSTRACT

A power semiconductor package includes a first substrate assembly with power semiconductor dies, a second substrate assembly arranged parallel to the first substrate assembly, and source contacts. The second substrate assembly has a copper cladding layer which defines a source copper cladding layer circuit having a bonding area which, when mechanically contacted, provides an electrical connection to the source copper cladding layer circuit. Each of the source contacts provide an electrical connection between a source connection of one of the power semiconductor dies and the source copper cladding layer circuit. The source contacts are arranged at different distances from the bonding area of the source copper cladding layer circuit. The source copper cladding layer circuit also has an electrically isolating slot arranged between one of the source contacts which is closest to the bonding area of the source copper cladding layer circuit and the bonding area.

6 Claims, 13 Drawing Sheets

(51) Int. Cl.

| | |
|---|---|
| ***H10W 70/60*** | (2026.01) |
| ***H10W 70/65*** | (2026.01) |
| ***H10W 90/00*** | (2026.01) |
| *H10W 40/10* | (2026.01) |
| *H10W 72/50* | (2026.01) |

(52) U.S. Cl.
CPC ........... *H10W 70/65* (2026.01); *H10W 90/00* (2026.01); *H10W 90/401* (2026.01); *H10W 40/10* (2026.01); *H10W 70/464* (2026.01); *H10W 72/50* (2026.01); *H10W 90/753* (2026.01); *H10W 90/754* (2026.01)

(58) Field of Classification Search
CPC . H10W 90/401; H10W 40/10; H10W 70/464; H10W 90/753; H10W 90/754
See application file for complete search history.

(56) References Cited

U.S. PATENT DOCUMENTS

| | | | | |
|---|---|---|---|---|
| 10,141,254 | B1 * | 11/2018 | Xu | H02M 7/003 |
| 2017/0170157 | A1 * | 6/2017 | Masuda | H10W 90/00 |
| 2019/0157744 | A1 * | 5/2019 | Orihara | H01Q 7/00 |
| 2023/0343756 | A1 * | 10/2023 | Igarashi | H10W 72/00 |

FOREIGN PATENT DOCUMENTS

| | | | | |
|---|---|---|---|---|
| EP | 3 598 490 | A1 | 1/2020 | |
| WO | WO 2015/176985 | A1 | 11/2015 | |
| WO | WO-2022207203 | A1 * | 10/2022 | H10W 90/401 |

* cited by examiner

POWER SEMICONDUCTOR PACKAGE

CROSS REFERENCE TO PRIOR APPLICATIONS

This application is a U.S. National Phase application under 35 U.S.C. § 371 of International Application No. PCT/EP2022/054763, filed on Feb. 25, 2022 and which claims benefit to International Patent Application No. PCT/EP2021/058654, filed on Apr. 1, 2021. The International Application was published in English on Oct. 6, 2022 as WO 2022/207203 A1 under PCT Article 21 (2).

FIELD

The present invention is directed to a power semiconductor package, in particular to a power semiconductor package with a first substrate assembly which comprises a plurality of power semiconductor dies and with a second substrate assembly which is arranged substantially parallel to the first substrate assembly and which comprises a copper cladding layer defining a source copper cladding layer circuit with a bonding area which is configured to be mechanically contacted so as to provide an electrical connection to the source copper cladding layer circuit.

The present invention also relates to high power density packaging of a plurality of power semiconductor dies having low power loop inductance, balanced parallel source inductances, high current handling capacity, high voltage creepage isolation, which can be manufactured at low cost using standard semiconductor packaging material, equipment and processes.

The present invention relates to packaging of semiconductor power transistors and apparatus and methods used to maximize power density while simultaneously minimizing the parasitic power loop inductance of and matching the source inductance between parallel power semiconductor transistors within the power module package.

BACKGROUND

A general goal of power semiconductor development is to increase their power density. This can be achieved by a reduction of size and volume of such packages, and/or by improving the current and voltage ratings of the power semiconductor package. Achieving a reduction of size and volume while simultaneously increasing current and voltage ratings, however, introduces opposing constraints. Making packages smaller causes the available space for the power semiconductor package power terminals to shrink. This usually results in a reduction of power terminal conductor cross section area and thus in higher power terminal resistance. A reduction of the available space for power terminals usually also constrains high voltage operation due to smaller creepage spacing between adjacent power terminals, between high voltage signal terminals, as well as between high voltage power or signal terminals and semiconductor package cooling surfaces and heat sinks bonded thereto.

Improvements in power semiconductor transistor technologies have resulted in very fast transistor switching speeds on the order of tens of amperes within a few nanoseconds. Turn-off voltage overshoot caused by parasitic power loop inductances of power semiconductor packages may, however, limit the switching speeds otherwise achievable.

Mismatches in parasitic common source inductances between parallel power semiconductor transistors can also cause imbalanced source-drain currents between paralleled transistors during turn-on and turn-off switching transients, which can result in non-uniform switching losses and non-uniform junction temperatures between paralleled transistors. The non-uniform switching losses result in reduced efficiency and the non-uniform transistor junction temperatures effectively reduce the thermal performance of the power semiconductor package. Large imbalances of source-drain currents between paralleled transistors may also cause oscillations resulting in unstable operation.

SUMMARY

An aspect of the present invention is to provide a power semiconductor package which allows for a reliable and efficient switching of relatively high electrical power.

In an embodiment, the present invention provides a power semiconductor package which includes a first substrate assembly which comprises a plurality of power semiconductor dies, a second substrate assembly which is arranged substantially parallel to the first substrate assembly, and a plurality of source contacts. The second substrate assembly comprises a copper cladding layer which defines a source copper cladding layer circuit which comprises a bonding area which is configured to be mechanically contacted so as to provide an electrical connection to the source copper cladding layer circuit. Each of the plurality of source contacts provides an electrical connection between a source connection of one of the plurality of power semiconductor dies of the first substrate assembly and the source copper cladding layer circuit of the second substrate assembly. The plurality of source contacts is arranged at different distances from the bonding area of the source copper cladding layer circuit. The source copper cladding layer circuit further comprises an electrically isolating slot which is arranged between a source contact of the plurality of source contacts which is closest to the bonding area of the source copper cladding layer circuit and the bonding area of the source copper cladding layer circuit.

BRIEF DESCRIPTION OF THE DRAWINGS

The present invention is described in greater detail below on the basis of embodiments and of the drawings in which.

DETAILED DESCRIPTION

Figure 1:
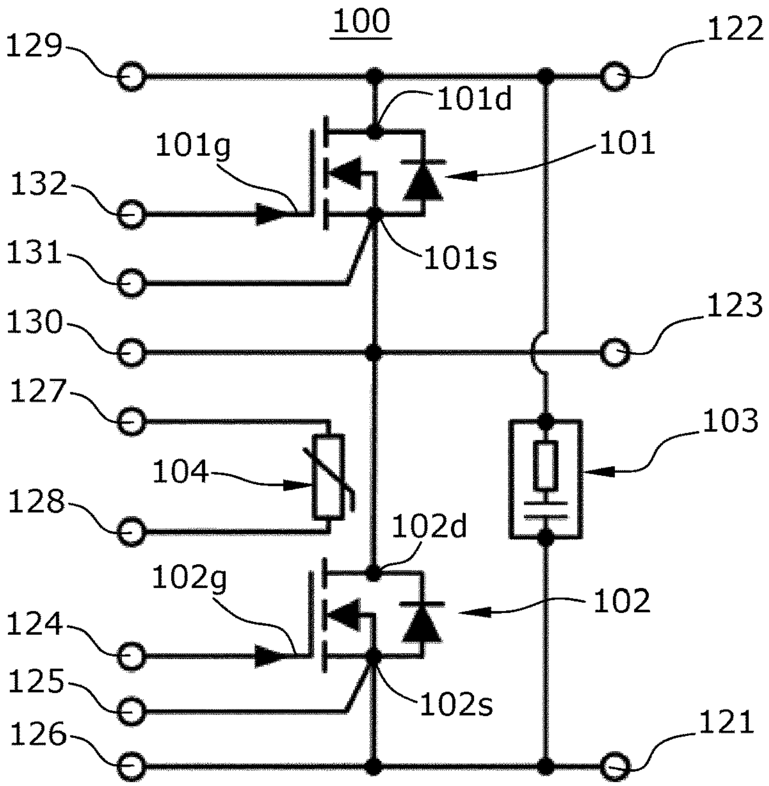
FIG. 1 illustrates a schematic electrical circuit diagram and a perspective view of a power semiconductor package according to the present invention.
Figure 1:
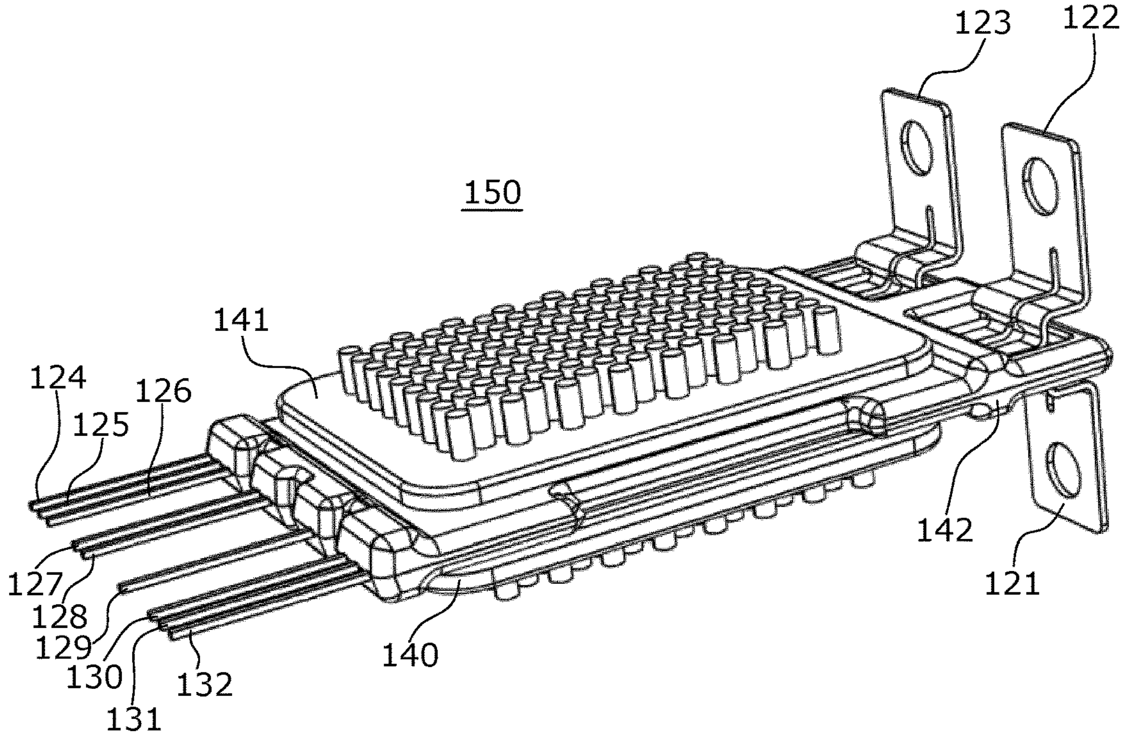

The power semiconductor package according to the present invention is provided with two substrate assemblies which are arranged on top of each other so that the second substrate assembly is arranged substantially parallel to the first substrate assembly.

The first substrate assembly is provided with a plurality of power semiconductor dies which are each electrically connected in parallel so as to define a power switch. The power semiconductor dies each comprise a semiconductor switch such as, for example, a metal-oxide-semiconductor-field-effect-transistor (MOSFET), an insulated-gate-bipolar-transistor (IGBT), or a high-electron-mobility-transistor (HEMT). Each power semiconductor die comprises an input connection which is typically located at a top surface of the power semiconductor die, an output connection which is typically located at bottom surface of the power semiconductor die, and a control connection. The input connection corresponds to, for example, the source connection of a MOSFET, the emitter connection of an IGBT, or the source connection of a HEMT. The output connection corresponds to, for example, the drain connection of a MOSFET, the collector connection of an IGBT, or the drain connection of a HEMT. The control connection corresponds to, for example, the gate connection of a MOSFET, the base connection of an IGBT, or the gate connection of a HEMT.

For simplicity, hereinafter, the input connection is referred to as the source of the power semiconductor die, the output connection is referred to as the drain of the power semiconductor die, and the control connection is referred to as the gate of the power semiconductor die.

Electrically connecting power semiconductor dies in parallel to each other means electrically interconnecting the sources of all these power semiconductors dies by an electrical source circuit, electrically interconnecting the drains of all these power semiconductors dies by an electrical drain circuit, and electrically interconnecting the gates of all these power semiconductors dies by an electrical gate circuit.

The second substrate assembly is provided with a copper cladding layer on that side which faces the first substrate assembly, wherein the copper cladding layer defines a source copper cladding layer circuit. The source copper cladding layer circuit is provided with a bonding area which is configured to be mechanically contacted so as to provide an electrical connection to the source copper cladding layer circuit. The bonding is typically substantially rectangular and elongated.

The power semiconductor package according to the present invention is also provided with a plurality of source contacts, each of which extends from the first substrate assembly to the second substrate assembly and provides an electrical connection between the source contact of one of the power semiconductor dies of the first substrate assembly and the source copper cladding layer circuit of the second substrate assembly. The source connections of the power semiconductor dies of the first substrate assembly are thus electrically interconnected via the source contacts and the source copper cladding layer circuit of the second substrate assembly. The source contacts are arranged at different distances from the bonding area of the source copper cladding layer circuit and typically extend substantially perpendicular to the parallel surfaces of the two substrate assemblies. The source contacts can, for example, be arranged on a straight line, wherein the straight line can, for example, be substantially perpendicular to a longitudinal dimension of the bonding area. The source contacts are typically separate elements which are made of a material with a relatively high electrical conductivity, and which are attached, typically bonded, to the source of the respective power semiconductor die as well as to the source copper cladding layer circuit.

It is generally possible that both substrate assemblies are each provided with a plurality of power semiconductors and with a copper cladding layer which defines a source copper cladding layer circuit. In this case, the source contacts provide an electrical connection between the source contacts of the power semiconductor dies of one substrate assembly and the source copper cladding layer circuit of the respective other substrate assembly.

According to the present invention, the source copper cladding layer circuit is provided with an electrically isolating slot which is arranged between that source contact, which is closest to the bonding area of the source copper cladding layer circuit, and the bonding area of the source copper cladding layer circuit. That source contact which is closest to the bonding area of the source copper cladding layer circuit is hereinafter referred to as the closest source contact. The term "between" in the present context means that the electrically isolating slot is arranged so that it interrupts the shortest source copper cladding layer circuit path between the bonding area and the closest source contact of a "virtual" source copper cladding layer circuit that is generally identically shaped, but does not have the electrically isolating slot. The electrically isolating slot, as a result, increases the effective current path length between the bonding area and the closest source contact, i.e., lengthens the path along which the electrical current flows between the bonding area and the closest source contact. The electrically isolating slot is typically left "empty", i.e., filled with air, but can generally be filled with any material having a relatively low electrical conductivity. The electrically isolating slot can, for example, be made by selectively removing material from the copper cladding layer.

The electrically isolating slot according to the present invention increases the effective current path length between the bonding area and the closest source contact, thereby resulting in a more uniform effective current path length between the bonding area and the individual source contacts. This reduces the mismatch between parasitic inductances of the sources of the individual power semiconductor dies, which provides for a more uniform switching of the power semiconductor dies connected in parallel. The semiconductor package according to the present invention can therefore switch a relatively high electrical power reliably and efficiently.

In an embodiment of the present invention, the electrically isolating slot can, for example, be provided to be substantially U-shaped in a plan view onto that surface of the second substrate assembly which is provided with the source copper cladding layer circuit, wherein the electrically isolating slot is arranged so that it surrounds the closest source contact at three sides. The term "side" in the present context refers to the four in-plane sides of a body in a plan view, i.e., the front side, the back side, and the two lateral sides. The term "surround" in the present context means that the electrically isolation slot extends at along the respective side of the closest source contact, but does not have to extend along the entire width of the respective side. The closed end of the U-shaped electrically isolating slot typically faces the bonding area. The two legs of the U-shaped electrically isolating slot are located at opposite sides of the closest source contact and can, for example, extend substantially parallel to a straight line on which the source contacts are arranged. The two legs of the U-shaped electrically isolating slot can, for example, be provided with different lengths. The U-shaped electrically isolating slot, which surrounds the closest source contact at three sides, allows a particularly uniform effective current path length between the bonding area and the individual source contacts to be realized and thus allows a particular uniform switching of the parallel-connected power semiconductor dies.

The electrically isolating slot can, for example, surround at least two source contacts, which means that the electrically isolating slot extends adjacent to two source contacts. The electrically isolating slot can, for example, surround each of the two contacts at two opposite sides. This allows a particularly uniform effective current path length between the bonding area and the individual source contacts to be realized and thus allows a particular uniform switching of the parallel-connected power semiconductor dies.

In an embodiment of the present invention, the source copper cladding layer circuit can, for example, be provided with at least one additional electrically isolating slot, i.e., the source copper cladding layer circuit is provided with at least two electrically isolating slots in total. Due to the plurality of electrically isolating slots, a particularly uniform effective current path length between the bonding area and the individual source contacts can be realized in a relatively simple manner.

The at least one electrically isolating slot of the source copper cladding layer circuit can, for example, be configured so that a ratio of a maximum peak turn-on current to a minimum peak turn-on current of the parallel-connected power semiconductor dies is no more than 1.1. The peak turn-on current of a power semiconductor die in the present context means the maximum current flowing through the respective power semiconductor die during a transient phase after the power semiconductor die is switched on. The maximum peak turn-on current is the peak turn-on current of that individual power semiconductor die with the highest peak turn-on current, and the minimum peak turn-on current is the peak turn-on current of that individual power semiconductor die with the lowest peak turn-on current. The maximum peak turn-on current to minimum peak turn-on current ratio of no more than 1.1 provides a very uniform switching of the parallel-connected power semiconductor dies so that the semiconductor package can switch a relatively high electrical power very reliably and efficiently.

The present disclosure, which includes improvements to packaging of a plurality of parallel semiconductor power dies describes embodiments that enable power semiconductor dies to operate at optimum performance, power density, and cost.

Embodiments of the present disclosure and their advantages are best understood by referring to the detailed description of the drawings below. It should thereby be appreciated that like reference numerals are used to identify like elements illustrated in one or more of the drawings, wherein the information there shown is for purposes of illustrating embodiments of the present invention and not for purposes of limiting the same.

The present invention, which describes improvements to packaging and cooling structures, describes embodiments that allow the package semiconductor power transistors to be more efficient, reliable, higher power density and more cost effective.

FIG. 1 schematically illustrates a power semiconductor half-bridge electrical circuit 100 of a high-side power switch 101 and a low-side power switch 102. In certain embodiments, each of the two power switches 101 and 102 comprises a plurality of parallel connected power semiconductor dies, further comprising one or more power semiconductor transistors and one or more power semiconductor diodes. In certain embodiments, each of the plurality of parallel connected semiconductor die may comprise a transistor having an intrinsic anti-parallel diode. In other embodiments, some of the plurality of parallel connected power semiconductor die may comprise a transistor and other parallel connected power semiconductor die may comprise an anti-parallel diode. In certain embodiments, the semiconductor transistors comprise a metal-oxide-semiconductor-field-effect-transistor MOSFET, an insulated-gate-bipolar-transistor IGBT, or a high-electron-mobility-transistor HEMT. In certain embodiments, the MOSFET, IGBT, and HEMT transistors and anti-parallel diodes may be formed from silicon, silicon carbide, gallium nitride, another III-V semiconductor, or other semiconductor materials. The bottom side power semiconductor die surface corresponding to the drain of MOSFET transistors, drain of HEMT transistors, collector of IGBT transistors, and the cathode of anti-parallel diodes will hereinafter be referred to as the drain connection of each die. The drain connections of the plurality of the power semiconductor die comprising the high-side power switch 101 are electrically connected in parallel to the drain 101*d* of the high-side power switch 101. The source connections of the plurality of power semiconductor die comprising the high-side power switch 101 are electrically connected in parallel to the electrical source current 101*s* of the high-side power switch 101. The top side power semiconductor die surface exposed pad area corresponding to the source of MOSFET transistors, source of HEMT transistors, emitter of IGBT transistors, and anode of anti-parallel diodes will hereinafter be referred to as the source connection of each die. The drain connections of the plurality of the power semiconductor die comprising the low-side power switch 102 are electrically connected in parallel to the drain 101*d* of the low-side power switch 102. The source connections of the plurality of power semiconductor die comprising the low-side power switch 102 are electrically connected in parallel to the electrical source current 102*s* of the low-side power switch 102. In certain exemplary embodiments, the drain 101*d* of the high-side power switch 101 is electrically connected to a high-side drain power terminal 122 and signal terminal 129. In certain exemplary embodiments, the electrical source current 102*s* of the low-side power switch 102 is electrically connected to a low-side source power terminal 121 and signal terminal 126. In certain exemplary embodiments, the electrical source current 101*s* of the high-side power switch 101 and drain 102*d* of the low-side power switch 102 are electrically connected to a mid-point power terminal 123 and high-side source/low-side drain signal terminal 130. The common electrical gate circuit 101*g* for the power semiconductor transistor dies comprising the high-side power switch 101 is electrically connected to signal pin 132. In certain exemplary embodiments, a common Kelvin source circuit for the power semiconductor dies comprising the high-side power switch 101 forms an electrical connection between 101*s* and signal terminal 131. The common electrical gate circuit 102*g* for the power semiconductor transistor dies for the low-side switch 102 is electrically connected to signal terminal 124. In certain exemplary embodiments, a common Kelvin source circuit for the power semiconductor dies comprising the low-side power switch 102 forms an electrical connection between 101*s* and signal terminal 131. In certain exemplary embodiments, the semiconductor package of the present invention includes a thermistor 104 having its first terminal electrically connected to signal terminal 127 and second terminal electrically connected to signal terminal 128. In certain exemplary embodiments, the semiconductor package of the present invention includes a plurality of resistive-capacitive RC snubber capacitor 103 having their terminals electrically connected between the drain 101*d* of the high-side power switch and electrical source circuit 102*s* of the low-side power switch 102. An exemplary embodiment of the final power semiconductor package structure 150 comprises a plurality of signal terminals on one side of the package, a plurality of power terminals 124~132 on the opposite side of the package, a plastic encapsulant body 142, a bottom side heatsink 140, and a top side heatsink 141.

Figure 2:
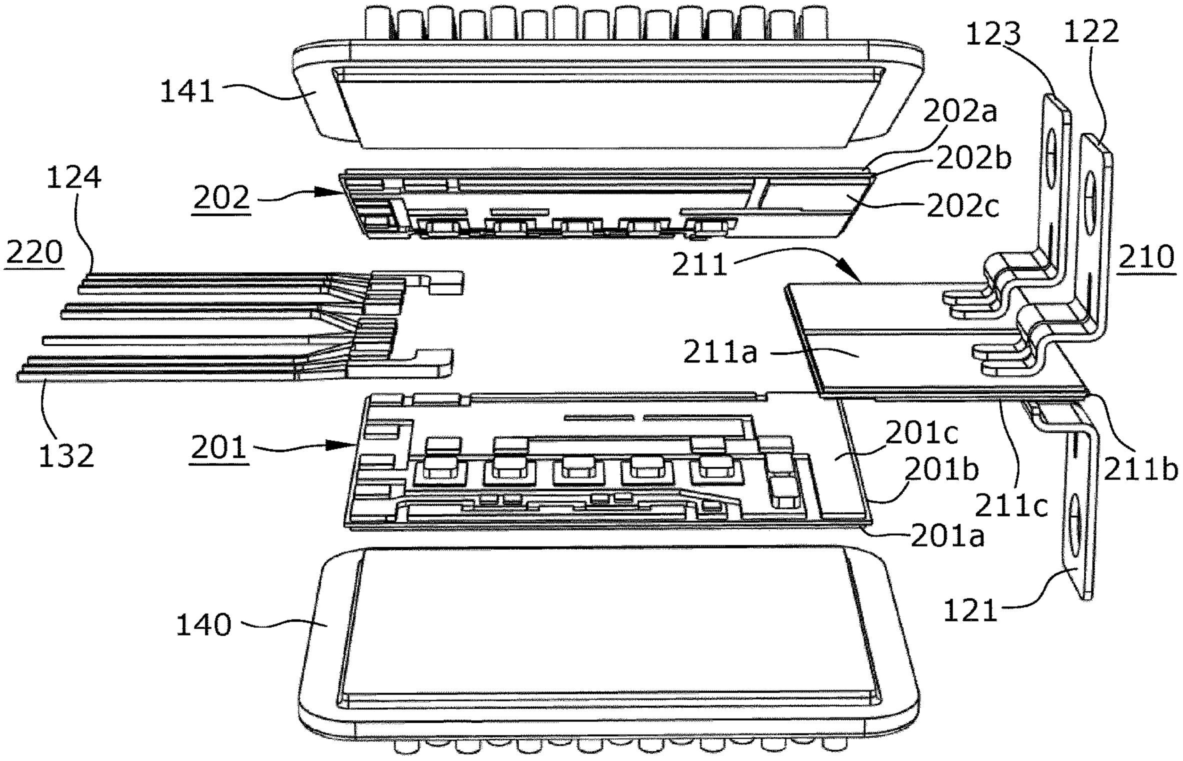
FIG. 2 illustrates an explosion illustration of components and subassemblies of the power semiconductor package of FIG. 1.

FIG. 2 illustrates the sub-assemblies and components comprising the semiconductor package structure of the present invention, not including the plastic encapsulant body 142. The semiconductor package structure comprises a first substrate assembly 201, a second substrate assembly 202, a signal terminal lead frame 220, a power terminal assembly 210, a bottom side heatsink 140, and an top side heatsink 141. The first substrate assembly 201, having an exemplary external copper cladding layer 201*a*, exemplary internal copper cladding layer 201*c*, the external and internal copper cladding layers being separated by an electrical isolation layer 201*b*. The second substrate assembly 202 has an exemplary external copper cladding layer 202*a*, exemplary internal copper cladding layer 202*c*, the external and internal copper cladding layers being separated by an electrical isolation layer 202*b*. The signal terminal lead frame comprises a plurality of signal terminals 124~132 made from copper or a copper alloy material. The exemplary power terminal assembly 210 comprises a power terminal substrate 211 having an exemplary first copper cladding layer 211*a*, an exemplary second copper cladding layer 211*c*, the first and second copper cladding layers being separated by an electrical isolation layer 211*b*, and a plurality of copper or copper alloy terminals 121~123 bonded to the first and second copper cladding layers.

Figure 3A:
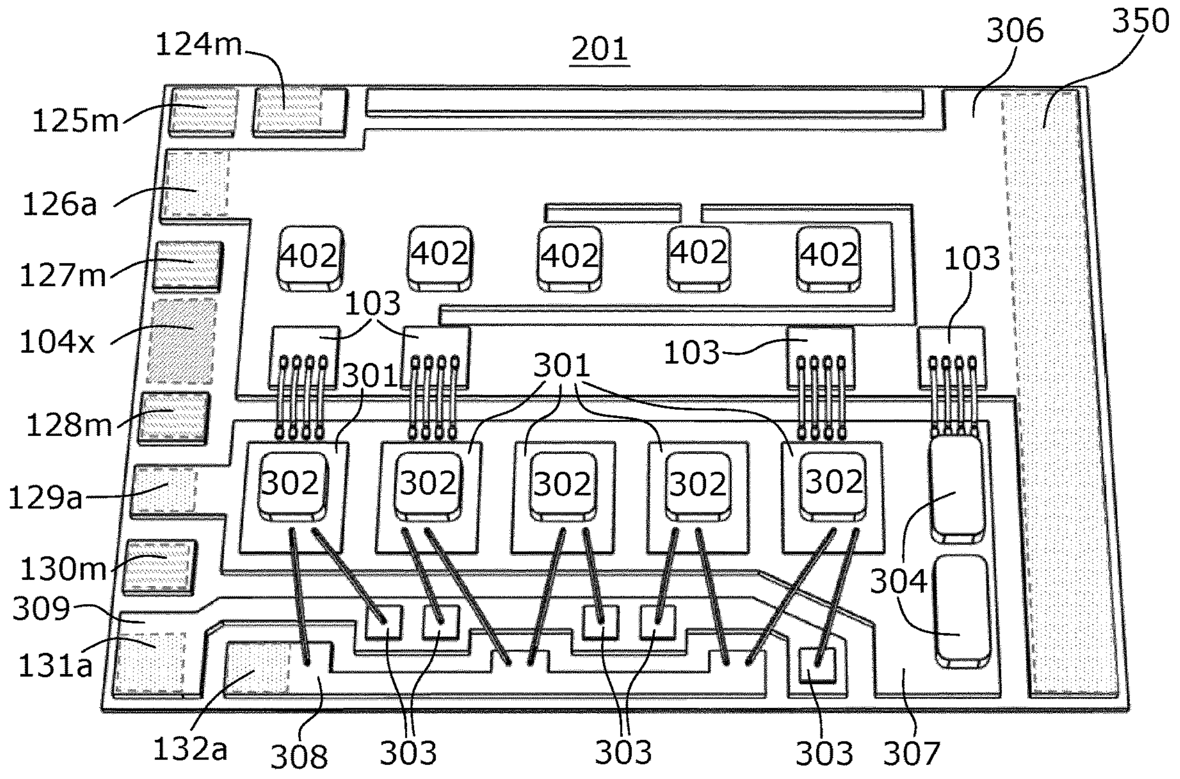
FIG. 3A illustrates a top view of an internal side of a first embodiment of a first substrate assembly of the semiconductor package of FIG. 1.

FIG. 3A illustrates an exemplary first substrate assembly 201. An exemplary copper cladding layer circuit 307 forms the electrical drain circuit 101*d* of the high-side power switch 101. An exemplary copper cladding layer circuit 306 forms the electrical source circuit 102*s* of the low-side power switch 102.

An exemplary high-side power switch 101 comprises five parallel power semiconductor transistor dies with intrinsic anti-parallel diodes 301, each die having its drain connection bonded to the electrical drain circuit 101*d* copper cladding layer circuit. Other exemplary implementations may use fewer or more dies in parallel. A vertical source contact 302 is bonded to the source connection of each such exemplary power semiconductor transistor die 301.

An exemplary copper cladding layer circuit 308 forms a common electrical gate circuit 101*g* for the high side power switch 101, having exemplary individual bond wire connections for each power semiconductor transistor die 301. An exemplary bonding area 132*a* is illustrated for bonding of the external gate signal terminal 132 to common gate circuit copper cladding layer circuit 308.

An exemplary copper cladding layer circuit 309 forms a common Kelvin source circuit for the power semiconductors comprising the high-side power switch 101. An exemplary implementation of such common Kelvin source circuit comprises a plurality of current limiting resistors 303, each having one terminal bonded to the common Kelvin source copper cladding layer circuit 309 and a second terminal wire bonded to the source pad of each power semiconductor transistor die 301. An exemplary bonding area 131*a* is illustrated for bonding of the external Kelvin source signal terminal 131 to common Kelvin source circuit copper cladding circuit 309. Using current limiting resistors may be required in certain exemplary embodiments to prevent excessive recirculating Kelvin source currents between parallel power semiconductor transistors from fusing Kelvin source bond wires. The magnitude of such recirculating currents could be excessively high in applications having high di/dt switching transients and a large threshold voltage mismatch between parallel connected power semiconductor transistor dies 301. Exemplary bonding area 128*m* supports mechanical bonding of the second thermistor signal terminal to the first substrate assembly 201. Exemplary area void of copper cladding layer 104*x* provides vertical mechanical bond wire clearance for thermistor 104 assembled on the second substrate. Exemplary bonding area 127*m* supports mechanical bonding of the second thermistor signal terminal to the first substrate assembly 201. Exemplary bonding area 126*a* supports electrical and mechanical bonding of the low-side source common signal terminal 126 to the first substrate assembly 201. Exemplary bonding area 125*m* supports mechanical bonding of the low-side Kelvin source signal terminal 125 to the first substrate assembly 201. Exemplary bonding area 124*m* supports mechanical bonding of the low-side gate signal terminal 124 to the first substrate assembly 201.

The bonding area 124*m* for the first signal terminal 124 and the bonding area 132*a* of the last signal terminal 132 of the present invention are each horizontally offset relative to the other signal terminal bonding areas and placed on the substrate sides perpendicular to the signal terminal side of the substrate. The advantages of such placements are that i) no increase is required to the width of the first 201 or second 202 substrate assemblies to support the number of exemplary signal terminals and ii) the exemplary thermistor can be placed within the lead frame bonding width using no additional area of the first 201 or second 202 substrate assemblies.

An exemplary electrical and mechanical bonding location on the first substrate assembly 201 for a plurality of vertical source contacts 402 for each power semiconductor transistor die source connection of the second substrate assembly 202.

Certain exemplary embodiments of the present invention incorporate a plurality of resistive-capacitive RC snubber capacitors 103 each having a first, bottom side terminal electrically and mechanically bonded to the copper cladding layer circuit 306 forming the electrical source circuit 102*s* of the low side power switch 102 and a second, top side terminal wire bonded to copper cladding layer circuit 307 forming the electrical drain circuit 101*d* of the high-side power switch 101. An advantage of the present invention is that each of the plurality of RC snubber capacitors 103 use separate, minimal length bond wires, resulting in minimal parasitic inductance and improved filtering performance. Other exemplary embodiments may omit such RC snubber capacitors 103.

An exemplary plurality of vertical power contacts 304 electrically and mechanically connect the electrical drain circuit 101*d* of the high-side power switch 101 between the first 201 and second 202 substrate assemblies.

An exemplary electrical and mechanical bonding area 350 for the electrical source circuit 102*s* of the low-side power switch 102 on the first substrate assembly 201 and corresponding circuit on the second copper cladding layer 211*c* of the power terminal substrate 211.

Figure 3B:
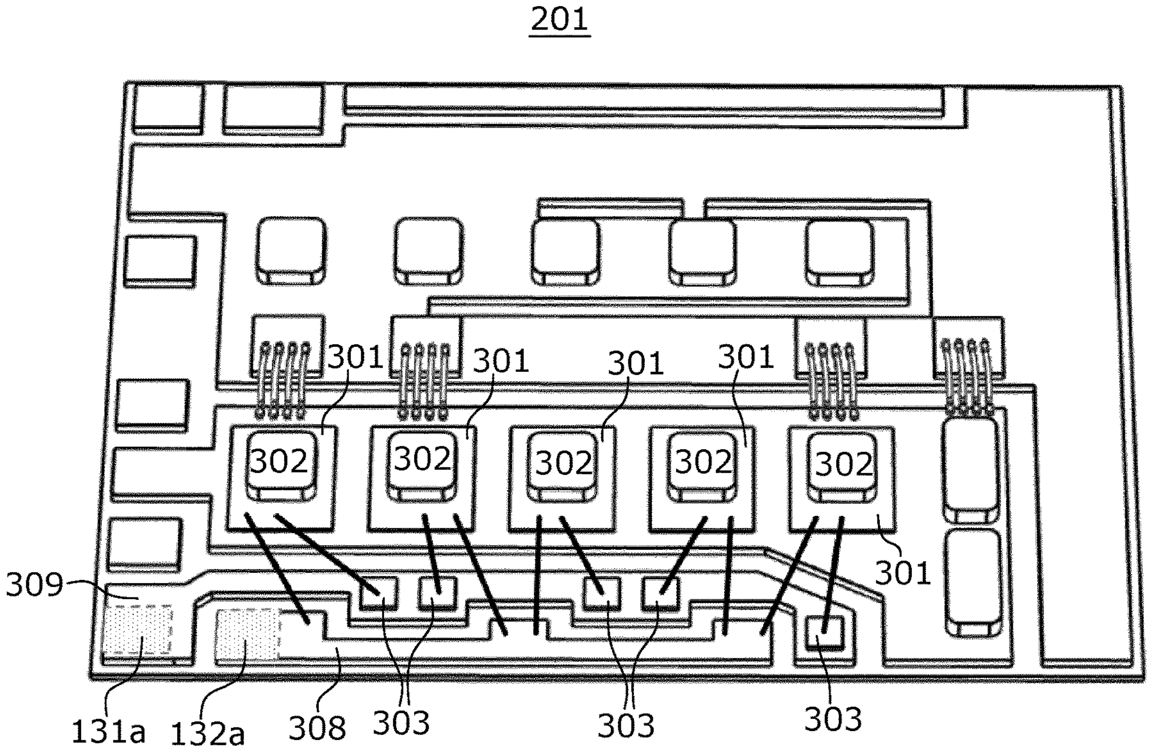
FIG. 3B illustrates a top view of an internal side of an alternative second embodiment of the first substrate assembly of the semiconductor package of FIG. 1.

FIG. 3B illustrates an alternate exemplary embodiment of bond wire configurations for the gate and Kelvin source circuits. An external gate control signal may be connected to signal terminal 131 having the bond wire from each resistor 303 connected to the gate pad of each respective power semiconductor transistor die 301. In such alternate embodiment, the bond wire associated with the source pad for each semiconductor power semiconductor transistor die 301 may be bonded to copper cladding layer circuit 308 and further connected to external signal terminal 132 forming a common Kelvin source return. Such alternate wire bonding configuration would provide increased gate resistance for each power semiconductor transistor die to mitigate parasitic gate-drain oscillations when using semiconductor power semiconductor transistor dies 301 having low gate-drain to gate-source capacitance ratios. Other exemplary embodiments may omit resistors 303 altogether.

The high-side common source signal terminal 130 is mechanically bonded to bonding area 130*m* on the first substrate assembly 201. The opposite side of the high-side common source signal terminal 130 is electrically and mechanically bonded to the high-side common electrical source circuit 101*s* on the second substrate. Both the Kelvin source as well as the common source gate return electrical circuits are connected to external signal terminals of the semiconductor package of the present invention. Use may be made of the common source return signal on high-side common source signal terminal 130 for partially hard switched and soft switched application circuits, whereas use of the external Kelvin source signal terminal 131 may, for example be used in hard switching application circuits. An advantage of the gate control and source return circuits of the present invention includes support for both Kelvin source and common source application circuits with the same semiconductor package. Another advantage includes simple bond wire configuration of resistors for current limiting or supplemental gate resistance adaptations using the same signal terminal and substrate materials resulting in improved economies of scale.

Figure 4:
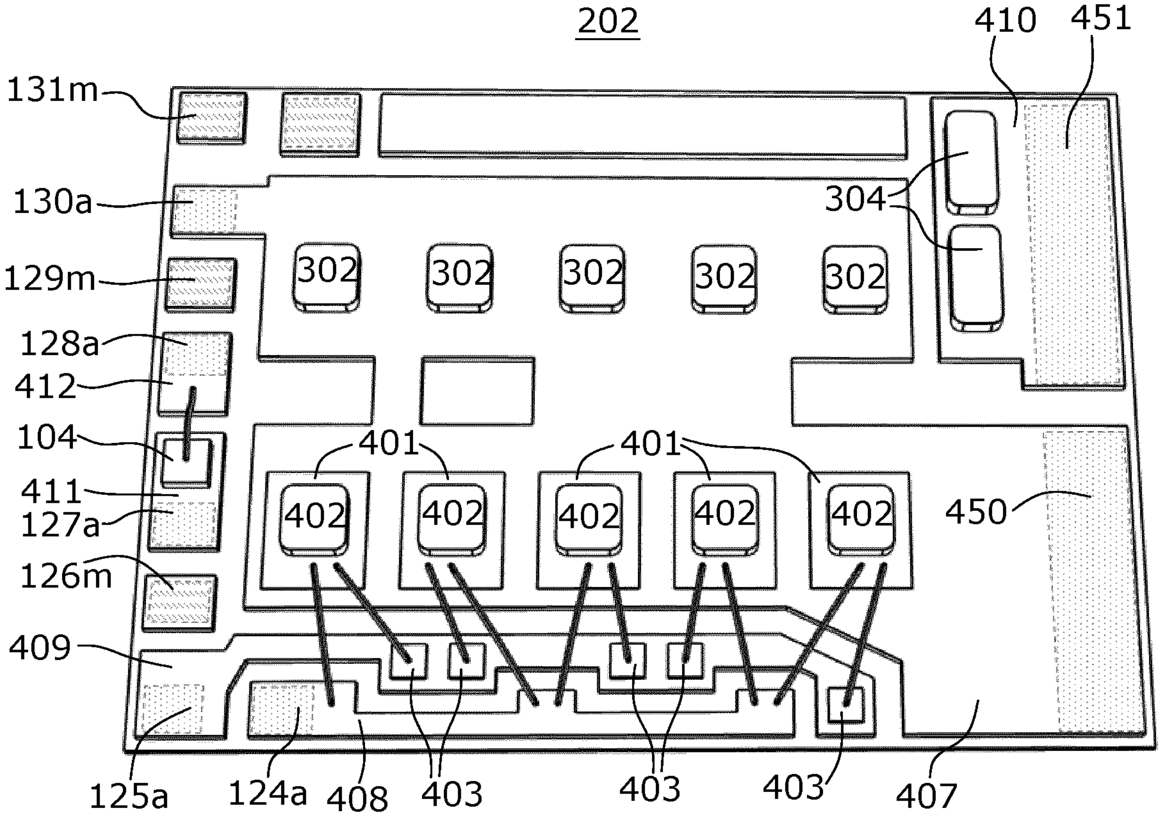
FIG. 4 illustrates a top view of an internal side of a second substrate assembly of the semiconductor package of FIG. 1.

FIG. 4 illustrates an exemplary second substrate assembly 202. An exemplary copper cladding layer circuit 407 forms the electrical drain circuit 102*d* of the low-side power switch 102 and electrical source circuit 101*s* of the high-side power switch 101. An exemplary copper cladding layer circuit 410 connects the electrical drain circuit 101*d* of the high-side power switch 101 through vertical power contacts 304 from the first substrate assembly 201 to an exemplary electrical and mechanical bonding area 451 to the corresponding circuit on the second copper cladding layer 211*c* of the power terminal substrate 211.

An exemplary low-side power switch 102 comprises five parallel power semiconductor transistor dies with intrinsic anti-parallel diodes 401, each die having its drain connection bonded to the electrical drain circuit 102*d* copper cladding layer circuit 407. Other exemplary embodiments may use fewer or more dies in parallel. A vertical source contact 402 is bonded to the source connection of each such exemplary power semiconductor transistor die 401.

An exemplary copper cladding layer circuit 408 forms a common electrical gate circuit 102*g* for the low-side power switch 102, having exemplary individual bond wire connections for each power semiconductor transistor die 401. An exemplary bonding area 124*a* is illustrated for bonding of the external gate signal terminal 124 to common gate circuit copper cladding layer circuit 408.

An exemplary copper cladding layer circuit 409 forms a common Kelvin source circuit for the power semiconductors comprising the low-side power switch 102. An exemplary implementation of such common Kelvin source circuit comprises a plurality of current limiting resistors 403, each having one terminal bonded to the common Kelvin source copper cladding layer circuit 409 and a second terminal wire bonded to the source pad of each power semiconductor transistor die 401. An exemplary bonding area 125*a* is illustrated for bonding of the external Kelvin signal terminal 125 to common Kelvin source circuit copper cladding layer circuit 409. The low-side common source signal terminal 126 is mechanically bonded to bonding area 126*m* on the second substrate assembly 202. The opposite side of signal terminal 126 is electrically and mechanically bonded to the low-side common electrical source circuit 102*s* on the first substrate. The exemplary gate circuit, Kelvin source circuit, common source circuit on this second substrate is symmetrical to the exemplary circuits in FIG. 3A and FIG. 3B disclosed for the first substrate. All exemplary embodiments and advantages disclosed for the corresponding circuit configurations on the first substrate are directly applicable to the second substrate.

Exemplary bonding area 127*a* on copper cladding circuit 411 supports electrical and mechanical bonding of the first thermistor signal terminal to the second substrate assembly 202. A first terminal on the bottom of the exemplary thermistor 104 is bonded to copper cladding circuit 411. An exemplary bond wire connects the second terminal on the top of the exemplary thermistor 104 to copper cladding layer circuit 412. Exemplary bonding area 128*a* on copper cladding circuit 411 supports electrical and mechanical bonding of the second thermistor signal terminal to the second substrate assembly 202. An advantage of the exemplary structure forming the bonding and signal pin connections for the thermistor is that such a structure is electrically isolated from high voltage circuits of the present semiconductor package. Another advantage of such a structure is that the thermistor 104 is geometrically placed near a low-side power semiconductor transistor die 401 thereby resulting in improved temperature correlation of thermistor 104 and power semiconductor transistor die 401. Exemplary bonding area 129*m* supports mechanical bonding of the high-side drain signal terminal 129 to the second substrate assembly 202. Exemplary bonding area 130*a* supports electrical and mechanical bonding of the low-side source signal terminal 130 to the second substrate assembly 202. Exemplary bonding area 131*m* supports mechanical bonding of the low-side external Kelvin source signal terminal 131 to the second substrate assembly 202 in some embodiments of the present invention. Exemplary bonding area 132*m* supports mechanical bonding of the low-side gate signal terminal 132 to the second substrate assembly 202 in some embodiments of the present invention.

The bonding area 124*m* for the first signal terminal 124 and the bonding area 132*a* for the last signal terminal 132 to the second substrate assembly 202 of the present invention are each horizontally offset relative to the other signal terminal bonding areas and placed on the substrate sides perpendicular to the signal terminal side of the substrate. The advantages of such placements are that i) no increase is required to the width of the first 201 or second 202 substrate assemblies to support the number of exemplary signal terminals and ii) the exemplary thermistor can be placed within the lead frame bonding width using no additional area of the first 201 or second 202 substrate assemblies.

An exemplary electrical and mechanical bonding location on the second substrate assembly 202 for a plurality of vertical source contacts 302 for each power semiconductor transistor die source connection of the first substrate assembly 201.

An exemplary plurality of vertical power contacts 304 of the first substrate assembly 201 electrically and mechanically connect the electrical drain circuit 101*d* of the high-side power switch 101 from the first substrate assembly 201 to copper cladding layer circuit 410 on the second substrate assembly 202.

An exemplary electrical and mechanical bonding area 451 on copper cladding layer circuit 410 connects the electrical drain circuit 101*d* of the high-side power switch 101 on the second substrate assembly 202 to a corresponding first copper cladding layer 211*a* of the power terminal substrate 211.

An exemplary bonding area 450 supports electrical and mechanical bonding of electrical drain circuit 102*d* of the low-side power switch 102 to a corresponding first copper cladding layer 211*a* of the power terminal substrate 211.

Figure 5:
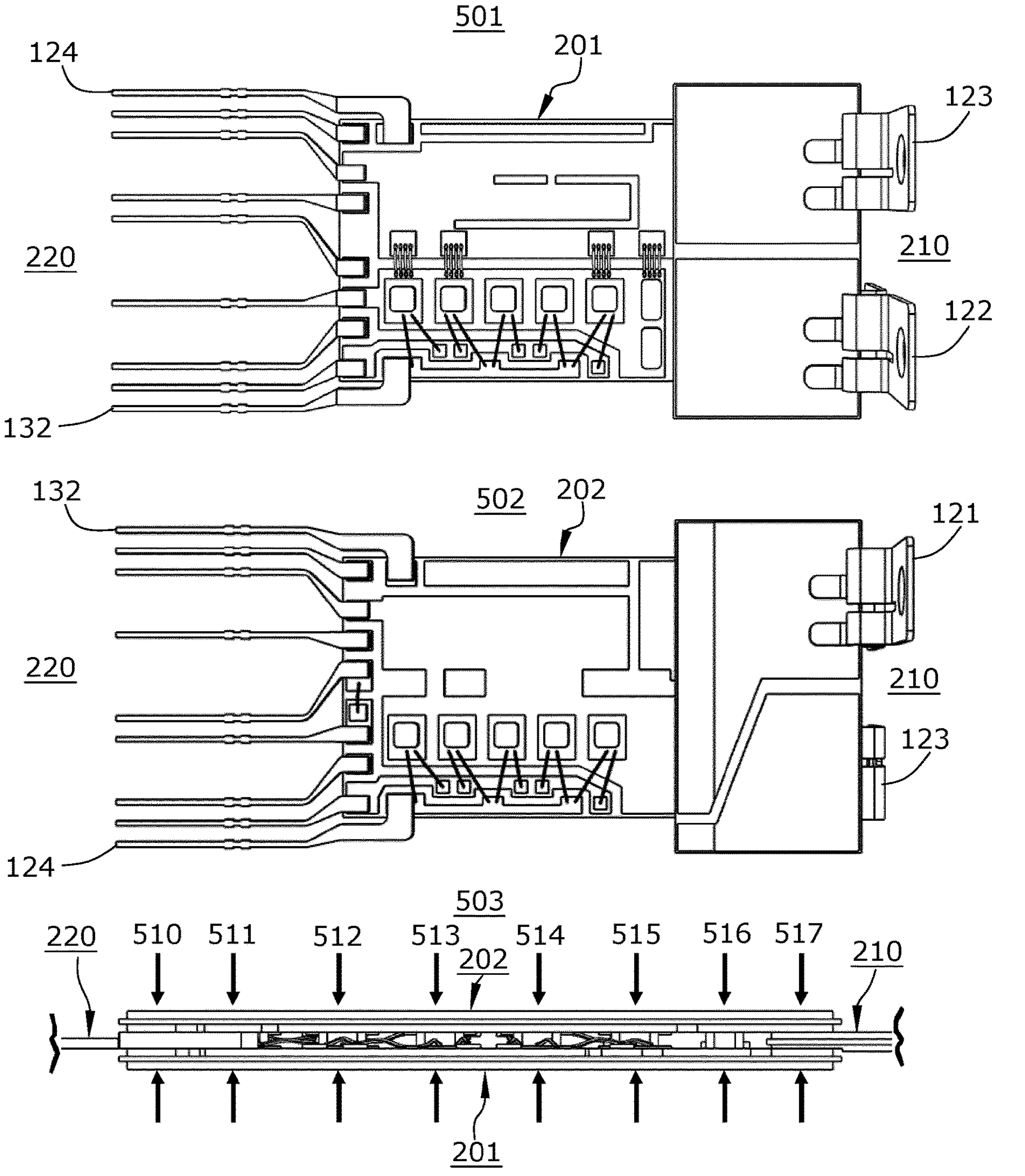
FIG. 5 illustrates alignment of the first substrate assembly, the second substrate assembly, a signal terminal lead frame, and a power terminal assembly of the semiconductor package of FIG. 1 relative to each other when assembled.

FIG. 5 illustrates how the first substrate assembly 201, second substrate assembly 202, signal terminal lead frame 220, and power terminal assembly 210 are aligned relative to each other when assembled in one exemplary embodiment of the present invention.

Illustration 501 shows an exemplary horizontal, x-y plane, alignment of the signal terminal lead frame 220, first substrate assembly 201, and power terminal assembly 210.

Illustration 502 shows an exemplary horizontal, x-y dimension, alignment of the signal terminal lead frame 220, second substrate assembly 202, and power terminal assembly 210.

Illustration 503 shows an exemplary assembly of the signal terminal lead frame 220, first substrate assembly 201, second substrate assembly 202, and power terminal assembly 210. Arrows 510~517 schematically illustrate the approximate positions of various bonds formed during assembly. Bond position 510 illustrates the bonds formed between the upper and lower surfaces of the signal terminal lead frame 220 and the corresponding plurality of bonding areas 125*a*~131*a* and 125*m*~131*m* on the first and second substrate. Bond position 511 illustrates the bonds formed between the upper and lower surfaces of signal terminal 124 and 132 and the corresponding plurality of bonding areas 124*a*, 124*m*, 132*a*, and 132*m* on the first and second substrate. Bond position 511 also illustrates the bonds formed between i) the leftmost vertical source contact 302 of the first substrate assembly 201 and its corresponding bonding position on the second substrate assembly 202 and ii) the leftmost vertical source contact 402 of the second substrate assembly 202 and its corresponding bonding position on the first substrate assembly 201. Bond positions 512~515 illustrates the bonds formed between i) the remaining vertical source contacts 302 of the first substrate assembly 201 and their corresponding bonding positions on the second substrate assembly 202 and ii) the remaining vertical source contacts 402 of the second substrate assembly 202 and their corresponding bonding positions on the first substrate assembly 201. Bond position 516 illustrates the bonds formed between the vertical power contacts 304 of the first substrate assembly 201 to their corresponding bonding positions on the second substrate assembly 202. Bond position 517 illustrates the bonds formed between i) bonding area 350 of the first substrate assembly 201 and corresponding bonding area 350*a* of the power terminal assembly 210 and ii) bonding areas 450 and 451 of the second substrate assembly 202 and corresponding bonding areas 450*a* and 451*a* of the power terminal assembly 210.

Advantages of the power semiconductor package structure of the present invention related to the assembly process include: i) assembly of the first and 201 and second 202 substrate assemblies only require assembly tolerance control in the horizontal, x-y dimension, such tolerances being well within the capabilities of industry standard power semiconductor packaging equipment and processes; ii) assembly of the first substrate assembly 201, second substrate assembly 202, signal terminal lead frame 220, and power terminal assembly 210 has significantly reduced horizontal, x-y dimension tolerance requirements compared with assembly tolerances for assembly of first 201 and second 202 substrate assemblies; and, iii) strict vertical, z-assembly dimension tolerances required for assembly of the first substrate assembly 201, second substrate assembly 202, signal terminal lead frame 220, and power terminal assembly 210 are readily achieved with industry standard thickness tolerances for signal terminal lead frame 220, power semiconductor transistor dies 301 and 401, vertical source contacts 302 and 402, and vertical power contacts 304. Only the power terminal substrate 211 requires non-standard processing to meet required thickness tolerances.

Figure 6A:
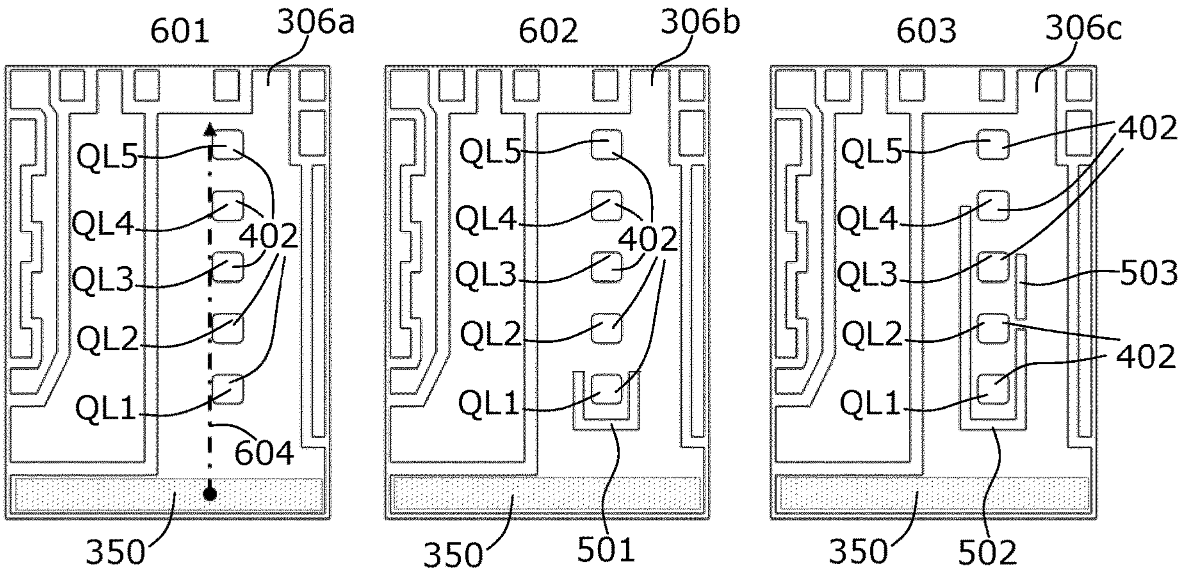
FIG. 6A illustrates different embodiments of copper cladding layer layouts of the first substrate assembly of the semiconductor package of FIG. 1.

FIG. 6A illustrates three exemplary embodiments of the copper cladding layer circuit 306 of the first substrate assembly 201 forming an electrical source circuit 102*s* of the low-side power switch 102.

Illustration of exemplary embodiment 601 shows five vertical source contacts 402 bonded to exemplary copper cladding circuit 306*a* the plurality of vertical source contacts 402 assembled substantially in line with the power terminal substrate 211 bonding area 350 as illustrated by 604. The position of each vertical source contact is labeled QL1~QL5 with QL1 being geometrically closest to bonding area 350 and QL5 being geometrically furthest from bonding area 350.

Illustration of exemplary embodiment 602 introduces a modified electrical source circuit 102*s* copper cladding layer circuit 306*b* having an electrically isolating slot 501 with a continuous span around the periphery of three sides of the vertical source contact 402 geometrically closest QL1 to bonding area 350. The advantage of such isolating slot 501 is to improve matching between the parallel parasitic source inductances between power terminal substrate 211 bonding area 350 and the plurality of vertical source contacts QL1~QL5.

Illustration of exemplary embodiment 603 introduces a modified electrical source circuit 102*s* copper cladding layer circuit 306*c* having two electrically isolating slots. A first electrically isolating slot 502 with a continuous span around the periphery of three sides of the vertical source contact 402 geometrically closest QL1 to bonding area 350 such slot span being extended to QL4 on one side and to QL2 on a second side. A second electrically isolating slot 503 with a span from QL2 to QL3. The advantage of such isolating slots 502 and 503 is to further improve matching between the parallel parasitic source inductances between power terminal substrate 211 bonding area 350 and the plurality of vertical source contacts QL1~QL5.

Figure 6B:
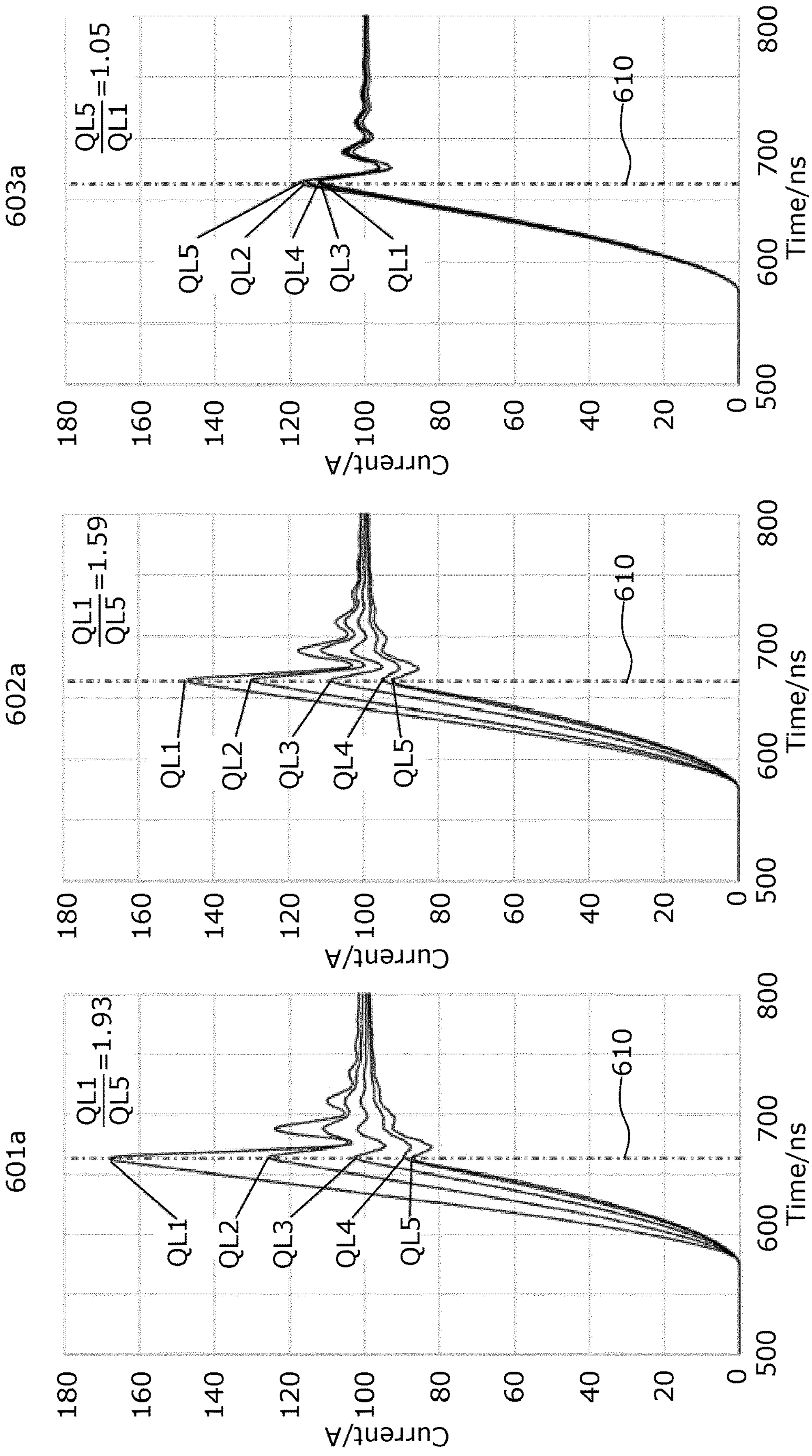
FIG. 6B illustrates exemplary turn-on current switching waveforms of power semiconductor dies of a low-side power switch of the semiconductor package of FIG. 1.

FIG. 6B illustrates circuit simulation results of turn-on currents for each parallel power semiconductor die bonded to vertical source contacts QL1-QL5 for each exemplary copper cladding layer geometries 306*a*, 306*b*, and 306*c* of FIG. 6A.

Illustration 601*a* shows the turn-on currents for QL1~QL5 for copper cladding circuit 306*a*. QL1 exhibits the highest peak current at a time indicated by line 610. At time instant 610, the ratio of the highest turn on current for QL1 over the lowest turn on current for QL5 is 1.93.

Illustration 602*a* shows the turn-on currents for QL1~QL5 for copper cladding circuit 306*b*. QL1 still exhibits the highest peak current at a time indicated by line 610. At time instant 610, the ratio of the highest turn on current for QL1 over the lowest turn on current for QL5 is reduced to 1.59.

Illustration 603*a* shows the turn-on currents for QL1~QL5 for copper cladding circuit 306*c*. QL5 now exhibits the highest peak current at a time indicated by line 610. At time instant 610, the ratio of the highest turn on current for QL5 over the lowest turn on current for QL1 is reduced to 1.05.

Exemplary embodiments of the present invention incorporating exemplary isolating slots 501, 502, and 503 of the present invention provide a balanced current sharing between exemplary parallel power semiconductor transistor dies 301 during dynamic switching conditions. Balanced current sharing minimizes differential switching losses between exemplary power semiconductor transistors dies 301 thereby resulting in uniform power semiconductor transistor die 301 temperatures and improved efficiency.

Figure 7A:
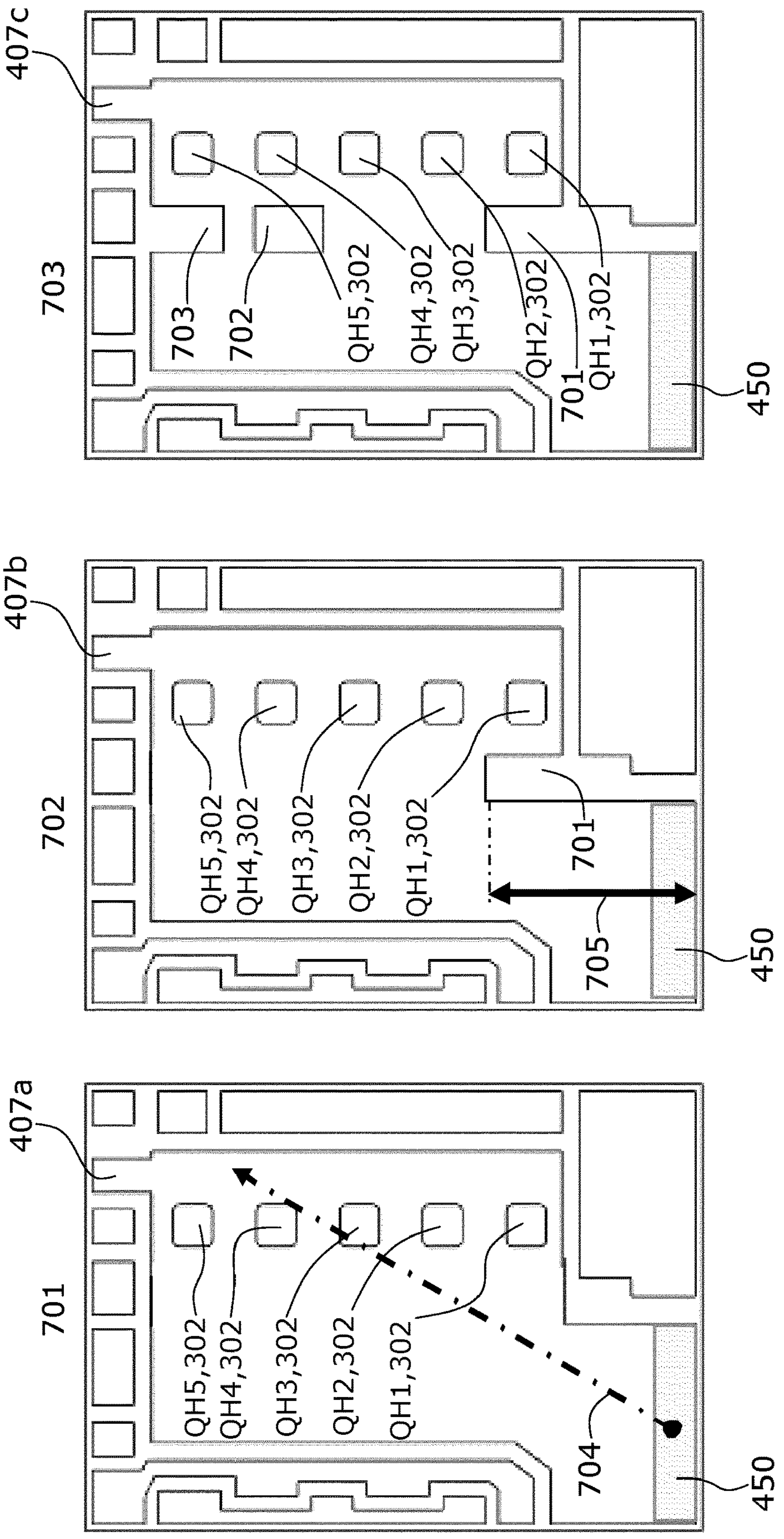
FIG. 7A illustrates different embodiments of copper cladding layer layouts of the second substrate assembly of the semiconductor package of FIG. 1.

FIG. 7A illustrates three exemplary embodiments of the copper cladding layer circuit 407 of the second substrate assembly 202 forming an electrical source circuit 101*s* of the high-side power switch 101.

Illustration of exemplary embodiment 701 shows five vertical source contacts 302 bonded to exemplary copper cladding circuit 407*a* the plurality of vertical source contacts 302 assembled substantially diagonal to the power terminal substrate 211 bonding area 450 as illustrated by 704. The position of each vertical source contact is labeled QH1~QH5 with QH1 being geometrically closest to bonding area 450 and QH5 being geometrically furthest from bonding area 450.

Illustration of exemplary embodiment 702 introduces a modified electrical source circuit 101*s* copper cladding layer circuit 407*b* having a first electrically isolating slot 701 with a continuous span illustrated by 705 from the edge of the copper cladding layer adjacent to bonding area 450 through the width of the vertical source contact 302 geometrically closest QH1 to bonding area 450. The advantage of such an isolating slot 501 is to improve matching between the parallel parasitic source inductances between power terminal substrate 211 bonding area 450 and the plurality of vertical source contacts QH1~QH5.

Illustration of exemplary embodiment 703 introduces a modified electrical source circuit 101*s* copper cladding layer circuit 407*c* having three electrically isolating slots. A first electrically isolating slot 701 with a continuous span from the edge of the copper cladding layer adjacent to bonding area 450 through the width of the vertical source contact 302 geometrically closest QH1 to bonding area 450. A second electrically isolating slot 702 is adjacent to QH4. A third electrically isolating slot 703 is adjacent to QH5. The advantage of such isolating slots 701, 702, and 703 is to further improve matching between the parallel parasitic source inductances between power terminal substrate 211 bonding area 450 and the plurality of vertical source contacts QH1~QH5.

Figure 7B:
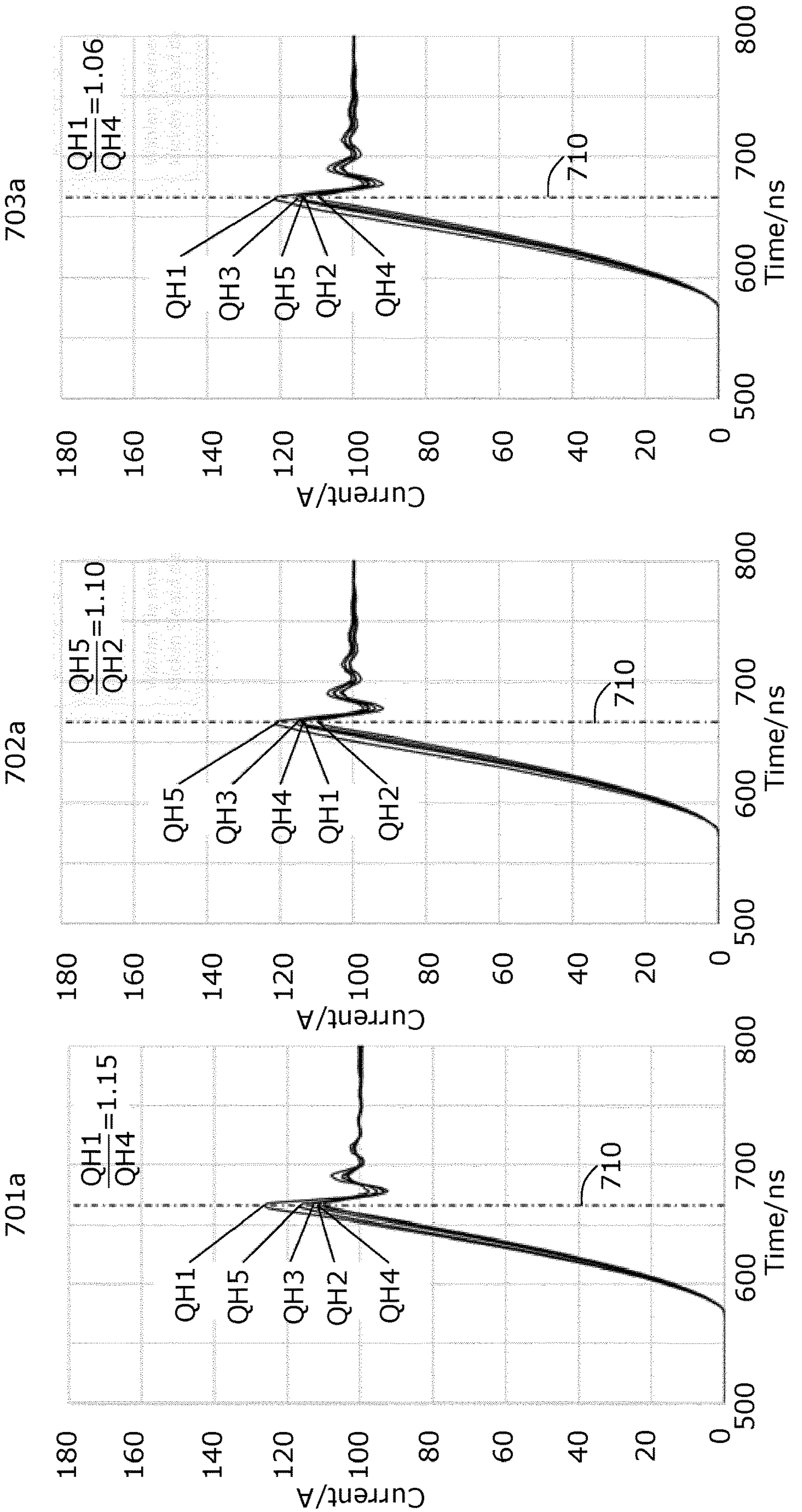
FIG. 7B illustrates exemplary turn-on current switching waveforms of power semiconductor dies of a high-side power switch of the semiconductor package of FIG. 1.

FIG. 7B illustrates circuit simulation results of turn-on currents for each parallel power semiconductor die bonded to vertical source contacts QH1-QH5 for each exemplary copper cladding layer geometries 407*a*, 407*b*, and 407*c* of FIG. 7A.

Illustration 701*a* shows the turn-on currents for QH1~QH5 for copper cladding circuit 407*a*. QH1 exhibits the highest peak current at a time indicated by line 710. At time instant 710, the ratio of the highest turn on current for QH1 over the lowest turn on current for QH5 is 1.15.

Illustration 702*a* shows the turn-on currents for QH1~QH5 for copper cladding circuit 407*b*. At time instant 710, the ratio of the highest turn on current for QH1 over the lowest turn on current for QH5 is reduced to 1.10.

Illustration 703*a* shows the turn-on currents for QH1~QH5 for copper cladding circuit 407*c*. At time instant 610, the ratio of the highest turn on current for QH1 over the lowest turn on current for QH1 is reduced to 1.06.

Exemplary embodiments of the present invention incorporating exemplary isolating slots 701, 702, and 703 of the present invention provide a balanced current sharing between exemplary parallel power semiconductor transistor dies 401 during dynamic switching conditions. Balanced current sharing minimizes differential switching losses between exemplary power semiconductor transistor dies 401 resulting in uniform power semiconductor transistor die 401 temperatures and improved efficiency.

Figure 8:
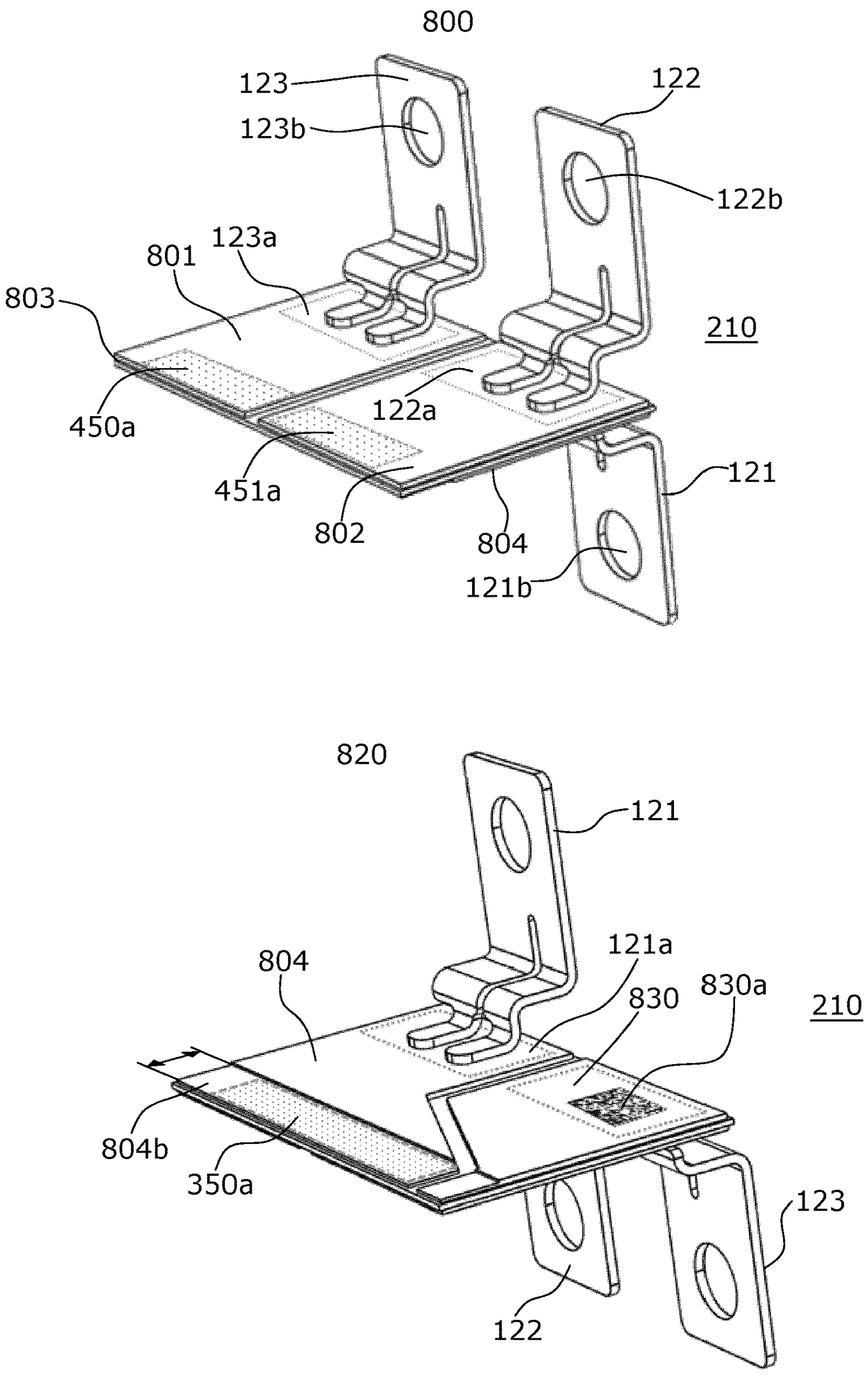
FIG. 8 illustrates two perspective views of the power terminal assembly of the semiconductor package of FIG. 1, which show a top side and a bottom side of the power terminal assembly.

FIG. 8 illustrates the top side 800 and bottom side 820 of an exemplary structure of a power terminal assembly 210 according to certain embodiments of the present invention. Power terminal assembly 210 comprises a power terminal substrate 211 and three power terminals 121~123.

In certain exemplary embodiments, such power terminal substrate 211 may be a direct-bonded-copper (DBC) substrate, an active-metal-braze (AMB) substrate, a direct-plated-copper (DPC) substrate, or a double-sided metal-core-printed-circuit-board (MCPCB).

In certain exemplary embodiments, material used for such power terminals 121~123 may be copper or copper alloys.

An exemplary copper cladding layer circuit 801 connects the electrical source circuit 101*s* of the high-side power switch 101 and the electrical drain circuit 102*d* of the low-side power switch 102 to mid-point power terminal 123. Bonding area 450*a* is electrically and mechanically bonded to bonding area 450 of the second substrate assembly 202.

Mid-point power terminal 123 is electrically and mechanically bonded to bonding area 123*a*.

An exemplary second copper cladding layer circuit 804 connects the electrical drain circuit 101*d* of the high-side power switch 101 to high-side drain power terminal 122. Bonding area 451*a* is electrically and mechanically bonded to mechanical bonding area 451 of the second substrate assembly 202. High-side mid-point drain power terminal 123 is electrically and mechanically bonded to bonding area 122*a*.

An exemplary second copper cladding layer circuit 804 connects the electrical source circuit 102*s* of the low-side power switch 102 to low-side source power terminal 121. Bonding area 350*a* is electrically and mechanically bonded to bonding area 350 of the first substrate assembly 201. Low-side source power terminal 121 is electrically and mechanically bonded to bonding area 121*a*.

Typical manufacturing thickness tolerances for power terminal substrate 211 materials are on the order of ±100 μm. A thickness tolerance on the order of ±30 μm is desired to achieve high manufacturing yield when assembling the present invention in mass production. In one exemplary embodiment of the present invention, the thickness of the copper cladding layer circuit 801 may be machined to achieve the desired thickness tolerance of the power terminal substrate 211 across the width 804*b* of bonding area 350*a*.

Copper cladding layer area 830 is electrically isolated from all circuits in the power semiconductor package. In certain embodiments of the present invention, such copper cladding layer area 830 may be used to imprint manufacturing traceability information using text, 2D bar codes, or 2D data matrix codes.

In certain exemplary embodiments of the present invention, exemplary power terminals 121~123 may be bonded to the power terminal substrate 211 using sintering. Sintering bonds may be formed using paste or film comprising silver, copper, platinum, palladium, or gold particles, microparticles, or nanoparticles. In other exemplary embodiments, such bonds may be formed using ultrasonic welding, laser welding, or electron-beam welding.

Exemplary embodiments of power terminals 121~123 of the present invention each include a hole 121*b*, 122*b*, 123*b* used connect such power terminals with bolts to external busbars. Other exemplary embodiments of such power terminals may omit such holes with bonds to external busbars formed using ultrasonic welding, laser welding, or electron-beam welding. In other exemplary embodiments of the present invention power terminals 121~123 may be omitted from the power semiconductor package. In such embodiments, the external busbars may be directly bonded to copper cladding layer bonding areas 121*a*, 122*a*, and 123*a* using ultrasonic welding, laser welding, or electron-beam welding.

Figure 9:
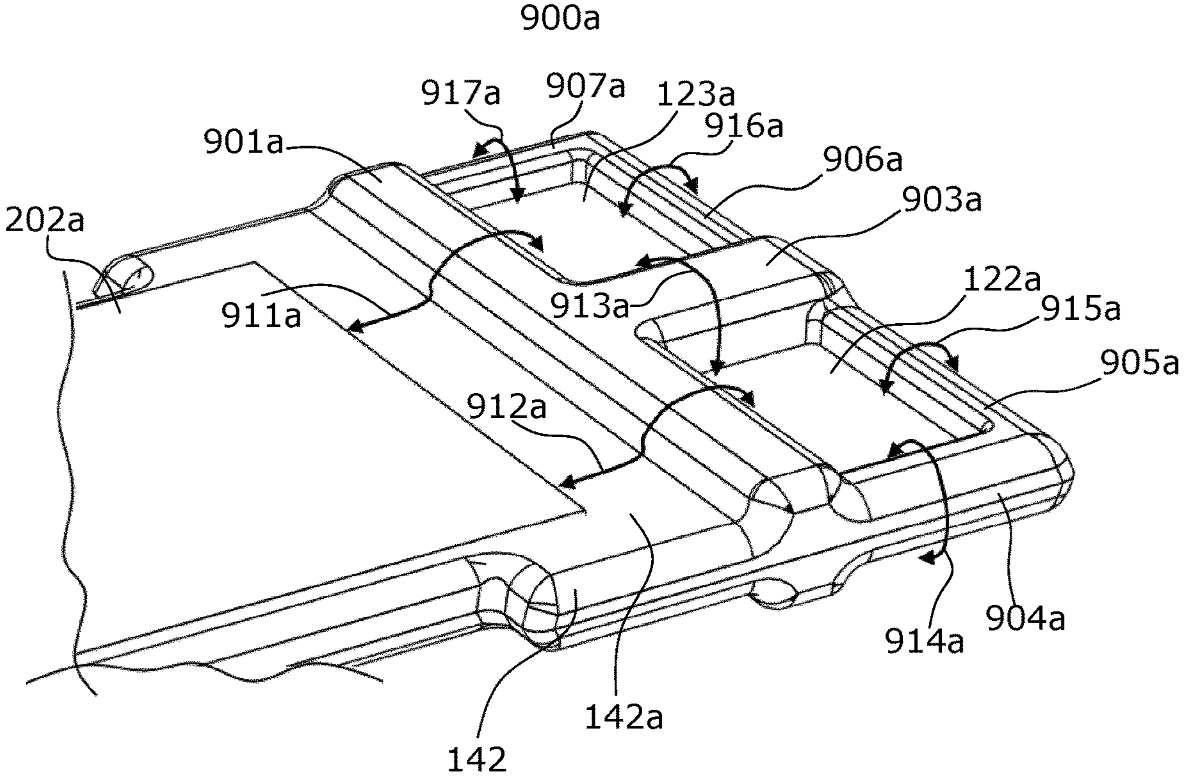
FIG. 9 illustrates two perspective views of a power terminal substrate plastic encapsulant body of the semiconductor package of FIG. 1, which show a top side and a bottom side of the power terminal substrate plastic encapsulant body.
Figure 9:
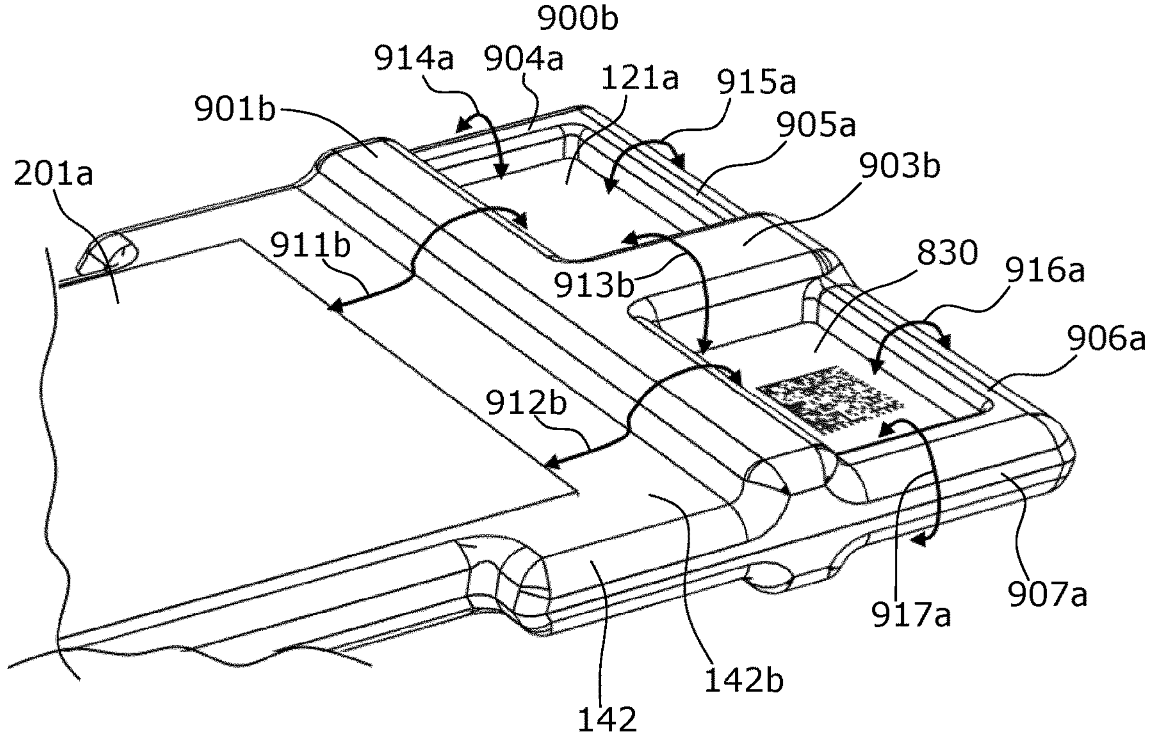

FIG. 9 illustrates the structure of an exemplary power terminal substrate 211 plastic encapsulant body 142 according to certain embodiments of the present invention.

Illustration 900*a* shows an exemplary embodiment of the top side of such plastic encapsulant body 142 of the present invention. The external copper cladding layer 202*a* covers a surface of the second substrate assembly 202; surfaces of power terminal bonding areas 122*a* and 123*a* are not encapsulated by the plastic encapsulant body 142. The surface 142*a* of the plastic encapsulant body 142 is recessed relative to the external copper cladding layer 202*a* surface to support obstruction free bonding of a heat sink to external copper cladding layer 202*a*.

The exemplary plastic encapsulant body 142 forms a ridge 901*a* across the width of the power semiconductor package. The ridge 901*a* is elevated relative to the plastic encapsulant body 142 surface 142*a*. An advantage of the exemplary ridge 901*a* is an extension of the electrical creepage dimensions 911*a* and 912*a* between the exposed external copper cladding layer 202*a* and the exposed power terminal bonding areas 122*a* and 123*a* of the power terminal substrate 211.

The exemplary plastic encapsulant body 142 forms a second ridge 903*a* between the power terminal bonding areas 122*a* and 123*a*. An advantage of the exemplary second ridge 903*a* is an extension of the electrical creepage dimension 913*a* between the exposed bonding areas 122*a* and 123*a* of the power terminal substrate 211.

The exemplary plastic encapsulant body 142 forms additional ridges 904*a*, 905*a*, 906*a*, and 907*a* around the periphery of the power terminal substrate 211. An advantage of the exemplary ridges 904*a*~907*a* is an extension of the electrical creepage dimensions 914*a*, 915*a*, 916*a*, and 917*a* between the exposed copper cladding layers on the top and bottom sides of the power terminal substrate 211.

Illustration 900*b* shows an exemplary illustration of the bottom side of the plastic encapsulant body 142. The bottom side of the plastic encapsulant body 142 is symmetrical to the top side of the plastic encapsulant body 142. Surface 142*b* is complementary to surface 142*a* in illustration 900*a*. Ridges 901*b* and 903*b* are complementary to ridges 901*a* and 903*a* in illustration 900*a*. Creepage dimensions 911*b*, 912*b*, and 913*b* are complementary to dimensions 911*a*, 912*a*, and 912*a* in illustration 900*a*.

Another advantage of exemplary ridges 901*a*, 903*a*, 904*a*, 905*a*, 906*a*, 907*a*, 901*b*, and 903*b* of the plastic encapsulant body 142 is improved mechanical support for the power terminal substrate 211.

Figure 10:
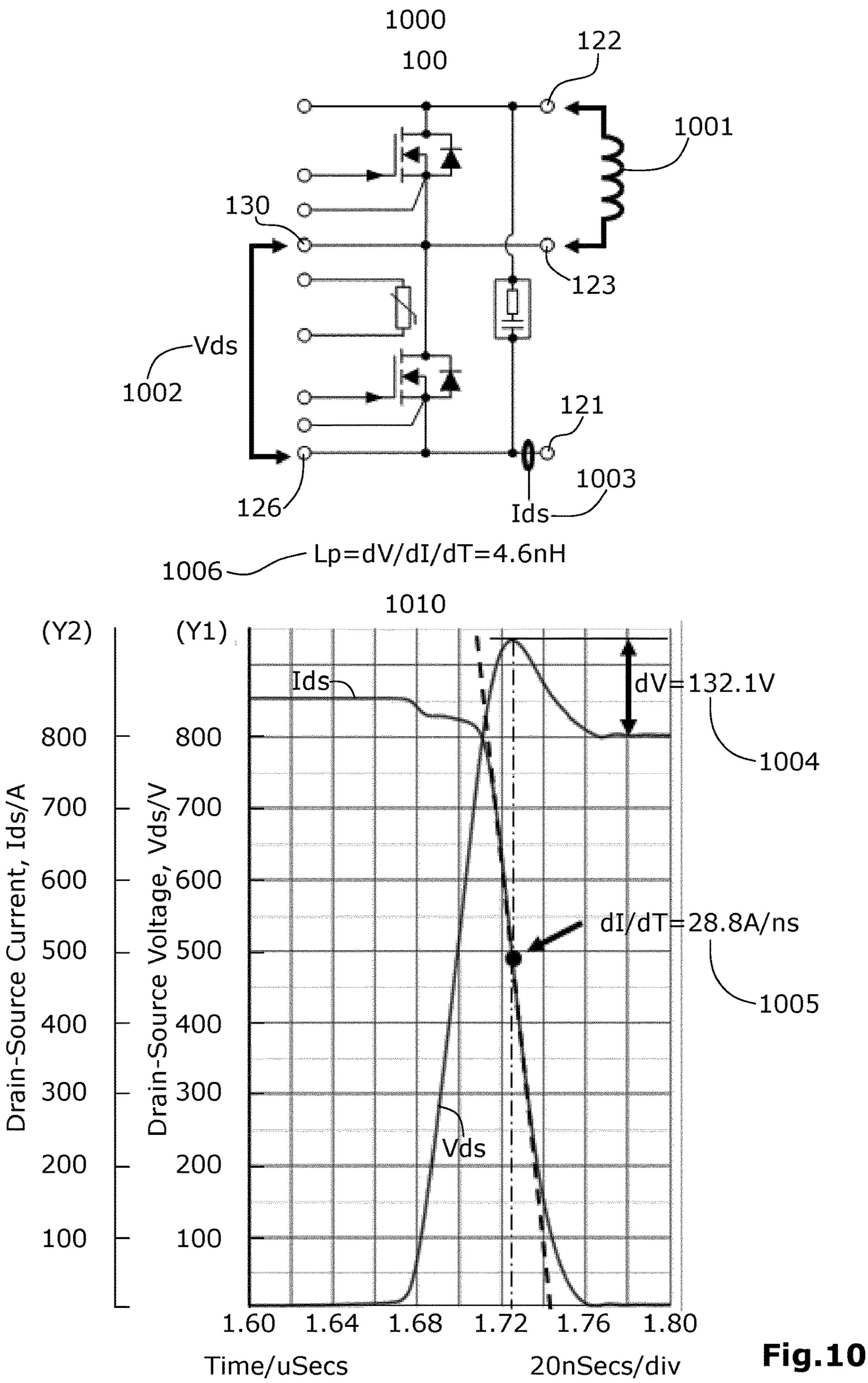
FIG. 10 illustrates the schematic electrical circuit diagram of FIG. 1 with indication of a drain-source voltage and a drain-source current of the low-side power switch of the semiconductor package of FIG. 1, and illustrates exemplary turn-off waveforms of the drain-source voltage and the drain-source current of the low-side power switch.

FIG. 10 illustrates exemplary power module low-side switch drain-source voltage and current turn-off waveforms according to certain embodiments of the present invention.

Additional advantages of the exemplary embodiment of the power terminal assembly 210 of the present invention include low parasitic power loop inductance and low power semiconductor package resistance.

The first copper cladding layer circuit 802 conducting current to the drain 101*d* of the high-side power switch 101 substantially overlaps the second copper cladding layer circuit 804 conducting current to the electrical source current 102*s* of the low-side power switch 102. Circuits 802 and 804 are further separated by a very thin power terminal substrate 211 electrical insulation layer 211*b*. The overlap and close geometric proximity of circuits 802 and 804 causes strong mutual inductance coupling between circuits 802 and 804 resulting in a reduction of the power loop inductance.

Two of the three power terminals 122 and 123 are bonded to one side of the power terminal substrate 211 with the third power terminal bonded to opposite side of the power terminal substrate 211. The effect of this arrangement is that each power terminal can be made 33% wider for a given power semiconductor package width compared with power semiconductor packages having three power terminals adjacent to each other. The achievable 33% increase in power terminal width from the exemplary embodiment of the present invention results in lower resistance of the power terminals. The reduction in the power terminal resistance combined with the present invention not having any bond wires in the power loop results in a very low power semiconductor package resistance of less than 0.075 milliOhm for the disclosed exemplary embodiment.

Illustration 1000 of FIG. 10 shows a simplified schematic of the power semiconductor half-bridge circuit 100 of the present invention. A low-side power switch 102 turn-off switching transient is simulated with an inductive load between power terminals 122 and 123 for a drain-source current of 850 A and drain-source voltage of 800V. The drain-source voltage 1002 of the low-side power switch 102 is measured across signal terminals 130 and 126. The drain-source current 1003 is measured at low-side source power terminal 121. Illustration 1010 shows the low-side power switch 102 drain-source voltage and drain-source current during such turn-off switching transient. The measured voltage overshoot magnitude 1004 and measured rate of change of current 1005 at time of the occurrence of the peak voltage correspond to a power loop inductance 1006 of 4.6 nH.

Figure 11:
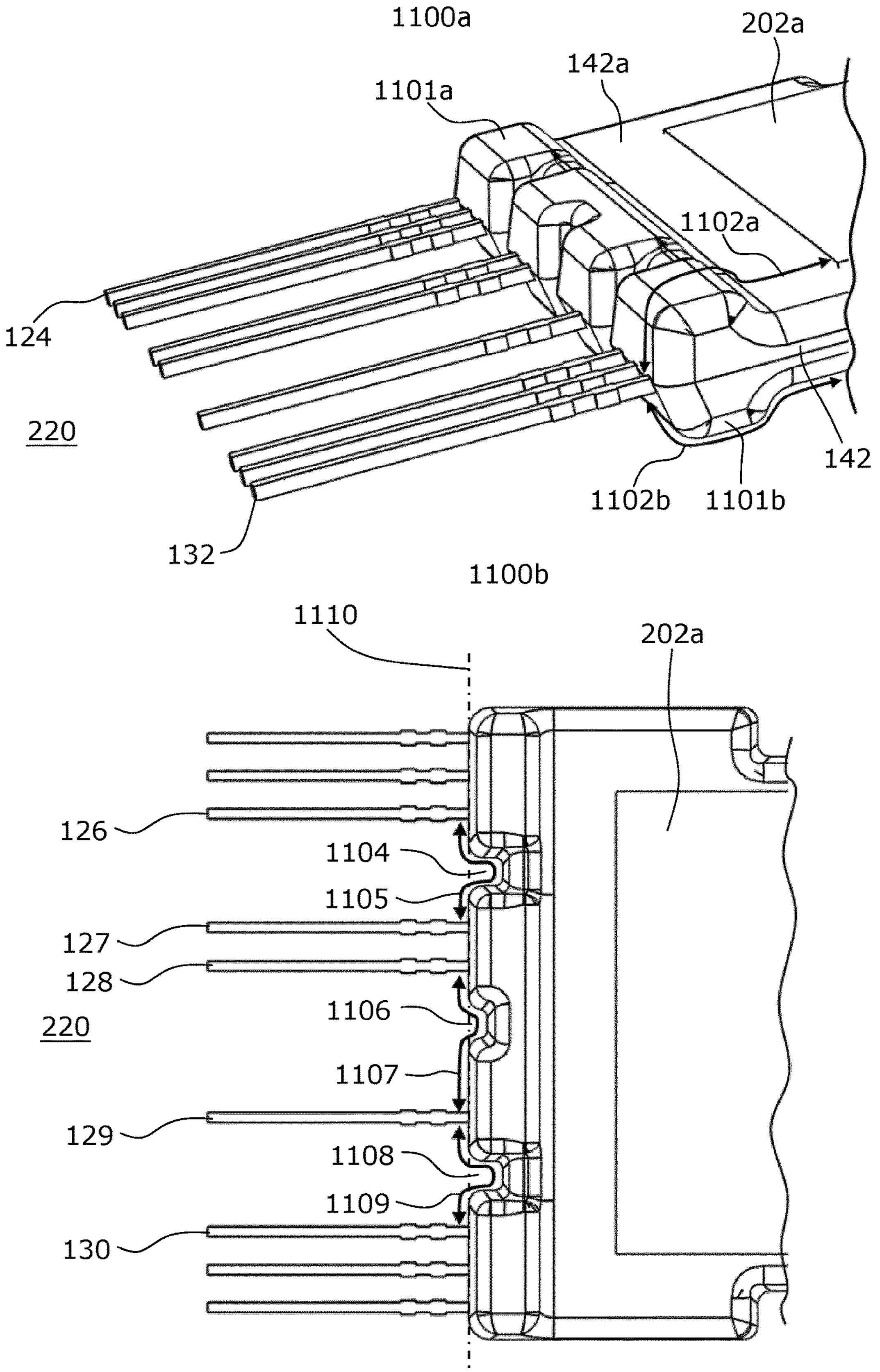
FIG. 11 illustrates a perspective view and a top view of a signal terminals plastic encapsulant body which encapsulates a plurality of signal terminals of the semiconductor package of FIG. 1.

FIG. 11 illustrates the structure of an exemplary signal terminal lead frame 220 plastic encapsulant body 142 according to certain embodiments of the present invention.

Illustration 1100*a* shows an exemplary embodiment of one side of such plastic encapsulant body 142 of the present invention. The plastic encapsulant body 142 partially encapsulates the exemplary signal terminals 124~132 to mechanically support the signal terminals and to provide electrical creepage isolation. The external copper cladding layer 202*a* surfaces of the second substrate assembly 202 and the external copper cladding layer 201*a* (not shown) of the first substrate assembly 201 are not encapsulated by the plastic encapsulant body 142. The surface 142*a* of plastic encapsulant body 142 is recessed relative to external copper cladding layer 202*a* surface to support obstruction free bonding of a heat sink to external copper cladding layer 202*a*.

The exemplary plastic encapsulant body 142 forms a ridge 1101*a* substantially across the width of the power semiconductor package. The ridge 1101*a* is elevated relative to the surface 142*a* of the plastic encapsulant body 142. An advantage of the exemplary ridge 1101*a* is an extension of the exemplary electrical creepage dimensions 1102*a* between the exposed external copper cladding layer 202*a* and the exposed signal terminals 123~132. In certain embodiments, the plastic encapsulant body 142 structure is symmetrical on the opposite side of the power semiconductor package (not shown). Ridge 1101*b* formed by the encapsulant body on the opposite side of the power semiconductor package of the present invention is symmetrical in structure to ridge 1101*a*.

Illustration 1100*b* shows an exemplary plurality of notches 1104, 1106, and 1108 indented relative to the edge 1110 of the plastic encapsulant body 142.

Exemplary notch 1104 extends the creepage dimension 1105 between the low-side electrical source circuit 102*s* signal terminal 126 and thermistor 104 signal terminal 127 required for safe high-voltage electrical isolation of the thermistor circuit.

Exemplary notch 1106 extends the creepage dimension 1107 between the high-side drain circuit 101*d* signal terminal 129 and thermistor 104 signal terminal 128 required for safe high-voltage electrical isolation of the thermistor circuit.

Exemplary notch 1108 extends the creepage dimension 1109 between the high-side drain circuit 101*d* signal terminal 129 and the high-side electrical source circuit 101*s* signal terminal 130 required for safe high-voltage electrical isolation of the thermistor circuit.

An advantage of the exemplary embodiment of the present invention having a plurality of such plastic encapsulant body 142 notches 1104, 1106 and 1108 is a 16% reduction of the required power semiconductor package width relative to a package having no notches, resulting in a smaller and higher power density power semiconductor package.

As used herein, the terms "comprises", "comprising", "includes", "including", "has", "having" or any contextual variants thereof, are intended to cover a non-exclusive inclusion. For example, a process, product, article, or apparatus that comprises a list of elements is not necessarily limited to only those elements, but may include other elements not expressly listed or inherent to such process, product, article, or apparatus. Further, unless expressly stated to the contrary, "or" refers to an inclusive or and not to an exclusive or. For example, a condition "A or B" is satisfied by any of the following: A is true (or present) and B is false (or not present), A is false (or not present) and B is true (or present), and both A and B is true (or present).

It will also be appreciated that one or more of the elements depicted in the drawings/figures can also be implemented in a more separated or integrated manner, or even removed or rendered as inoperable in certain cases, as is useful in accordance with a particular application. Reference should also be had to the appended claims.

LIST OF REFERENCE CHARACTERS

100 Power semiconductor half-bridge circuit
101 High-side power switch
101*d* Drain (of high-side power switch 101)/Electrical drain circuit/High-side drain terminal
101*g* Common electrical gate circuit
101*s* Electrical source current (of high-side power switch 101)/Electrical source circuit
102 Low-side power switch
102*d* Drain (of low-side power switch 102)/Electrical drain circuit
102*g* Common electrical gate circuit
102*s* Electrical source current (of low-side power switch 102)/Electrical source circuit
103 RC snubber capacitor
104 Thermistor
104*x* Copper cladding layer
121 Low-side drain power terminal
121*a* Bonding area
121*b* Hole
122 High-side drain power terminal
122*a* Bonding area
122*b* Hole
123 Mid-point power terminal
123*a* Bonding area
123*b* Hole
124 Signal terminal/First signal terminal
124*a* Bonding area
124*m* Bonding area
125 Signal terminal
125*a* Bonding area
125*m* Bonding area
126 Signal terminal/Low-side source common signal terminal
126*a* Bonding area
126*m* Bonding area
127 Signal terminal
127*a* Bonding area
127*m* Bonding area
128 Signal terminal

128*a* Bonding area
128*m* Bonding area
129 Signal terminal/High-side drain signal terminal
129*a* Bonding area
129*m* Bonding area
130 Signal terminal/High-side source/low-side drain signal terminal/High-side common source signal terminal/Low-side source signal terminal
130*a* Bonding area
130*m* Bonding area
131 Signal terminal/External Kelvin source signal terminal
131*a* Bonding area
131*m* Bonding area
132 Signal terminal/Last signal terminal
132*a* Bonding area
140 Bottom side heatsink
141 Top side heatsink
142 Plastic encapsulant body
142*a* Surface (of plastic encapsulant body 142)
142*b* Surface
150 Final power semiconductor package structure
201 First substrate assembly
201*a* External copper cladding layer
201*b* Electrical isolation layer
201*c* Internal copper cladding layer
202 Second substrate assembly
202*a* External copper cladding layer
202*b* Electrical isolation layer
202*c* Internal copper cladding layer
210 Power terminal assembly
211 Power terminal substrate
211*a* First copper cladding layer
211*b* Electrical insulation layer
211*c* Second copper cladding layer
220 Signal terminal lead frame
301 Power semiconductor transistor die
302 Vertical source contact
303 Resistor
304 Vertical power contact
306 Copper cladding layer circuit
306*a* Copper cladding circuit
306*b* Copper cladding circuit
306*c* Copper cladding circuit
307 Copper cladding layer circuit
308 Copper cladding layer circuit
309 Copper cladding layer circuit
350 Bonding area
350*a* Bonding area
401 Power semiconductor transistor die
402 Vertical source contact
403 Resistor
407 Copper cladding layer circuit
407*a* Copper cladding circuit
407*b* Copper cladding circuit
407*c* Copper cladding layer circuit
408 Copper cladding layer circuit
409 Copper cladding layer circuit
410 Copper cladding layer circuit
411 Copper cladding circuit
412 Copper cladding layer circuit
450 Bonding area
450*a* Bonding area
451 Mechanical bonding area
451*a* Bonding area
501 Isolating slot
502 Isolating slot
503 Isolating slot
510 Bond position
511 Bond position
512 Bond position
513 Bond position
514 Bond position
515 Bond position
516 Bond position
517 Bond position
604 Dashed line
701 First isolating slot
702 Second isolating slot
703 Third isolating slot
704 Dashed line
705 Continuous span
710 Time
800 Top side
801 Copper cladding layer circuit
802 First copper cladding layer circuit
804 Second copper cladding layer circuit
804*b* Width (of bonding area 350*a*)
820 Bottom side
830 Copper cladding layer area
901*a* Ridge
901*b* Ridge
903*a* Second ridge
903*b* Ridge
904*a* Additional ridge
905*a* Additional ridge
906*a* Additional ridge
907*a* Additional ridge
911*a* Electrical creepage dimension
911*b* Creepage dimension
912*a* Electrical creepage dimension
912*b* Creepage dimension
913*a* Electrical creepage dimension
913*b* Creepage dimension
914*a* Electrical creepage dimension
915*a* Electrical creepage dimension
916*a* Electrical creepage dimension
917*a* Electrical creepage dimension
1002 Drain-source voltage
1003 Drain-source current
1004 Measured voltage overshoot magnitude
1005 Measured rate of change of current
1006 Power loop inductance
1101*a* Ridge
1101*b* Ridge
1102*a* Electrical creepage dimension
1102*b* Creepage dimension
1104 Notch
1105 Creepage dimension
1106 Notch
1107 Creepage dimension
1108 Notch
1109 Creepage dimension
1110 Edge
Ids Drain source current
QL1 Vertical source contact
QL2 Vertical source contact
QL3 Vertical source contact
QLA Vertical source contact
QL5 Vertical source contact
QH1 Vertical source contact
QH2 Vertical source contact
QH3 Vertical source contact
QH4 Vertical source contact QH5 Vertical source contact
Vds Drain source voltage

What is claimed is:

1. A power semiconductor package comprising:

a first substrate assembly which comprises a plurality of power semiconductor dies;

a second substrate assembly which is arranged substantially parallel to the first substrate assembly, the second substrate assembly comprising a copper cladding layer which defines a source copper cladding layer circuit which comprises a bonding area which is configured to be mechanically contacted so as to provide an electrical connection to the source copper cladding layer circuit; and a plurality of source contacts each of which provides an electrical connection between a source connection of one of the plurality of power semiconductor dies of the first substrate assembly and the source copper cladding layer circuit of the second substrate assembly, the plurality of source contacts being arranged at different distances from the bonding area of the source copper cladding layer circuit, wherein, the source copper cladding layer circuit further comprises an electrically isolating slot which is arranged between a source contact of the plurality of source contacts which is closest to the bonding area of the source copper cladding layer circuit and the bonding area of the source copper cladding layer circuit.

2. The power semiconductor package as recited in claim 1, wherein the electrically isolating slot is substantially U-shaped and is arranged to surround the source contact of the plurality of source contacts which is closest to the bonding area of the source copper cladding layer circuit at three sides.

3. The power semiconductor package as recited in claim 1, wherein the electrically isolating slot is arranged to surround at least two source contacts of the plurality of source contacts.

4. The power semiconductor package as recited in claim 1, wherein the electrically isolating slot is configured so that so that a ratio of a maximum peak turn-on current to a minimum peak turn-on current of the plurality of power semiconductor dies does not exceed 1.1.

5. The power semiconductor package as recited in claim 1, wherein the source copper cladding layer circuit further comprises at least one additional electrically isolating slot.

6. The power semiconductor package as recited in claim 5, wherein the electrically isolating slot and the at least one additional electrically isolating slot are configured so that a ratio of a maximum peak turn-on current to a minimum peak turn-on current of the plurality of power semiconductor dies does not exceed 1.1.

* * * * *